United States Patent
Salinas et al.

(10) Patent No.: US 12,325,914 B2
(45) Date of Patent: Jun. 10, 2025

(54) PRECURSOR DELIVERY SYSTEM AND METHOD FOR CYCLIC DEPOSITION

(71) Applicant: Eugenus, Inc., San Jose, CA (US)

(72) Inventors: Martin J. Salinas, Campbell, CA (US); Miguel Saldana, Santa Cruz, CA (US); Victor Calderon, Santa Clara, CA (US)

(73) Assignee: Eugenus, Inc., San Jose, CA (US)

( * ) Notice: Subject to any disclaimer, the term of this patent is extended or adjusted under 35 U.S.C. 154(b) by 376 days.

(21) Appl. No.: 17/584,126

(22) Filed: Jan. 25, 2022

(65) Prior Publication Data

US 2022/0251704 A1    Aug. 11, 2022

Related U.S. Application Data

(60) Provisional application No. 63/142,238, filed on Jan. 27, 2021.

(51) Int. Cl.
| | |
|---|---|
| *C23C 16/455* | (2006.01) |
| *C23C 16/34* | (2006.01) |
| *H01L 21/02* | (2006.01) |

(52) U.S. Cl.
CPC ........ *C23C 16/45527* (2013.01); *C23C 16/34* (2013.01); *C23C 16/345* (2013.01); *C23C 16/45561* (2013.01); *H01L 21/02186* (2013.01); *H01L 21/0228* (2013.01)

(58) Field of Classification Search
CPC ............... H01L 21/02186; H01L 21/0228
See application file for complete search history.

(56) References Cited

U.S. PATENT DOCUMENTS

| | | | |
|---|---|---|---|
| 2005/0223979 A1* | 10/2005 | Shajii | G05D 7/0658 |
| | | | 118/692 |
| 2007/0158025 A1 | 7/2007 | Larson | |
| 2010/0266765 A1* | 10/2010 | White | C23C 16/45561 |
| | | | 427/248.1 |
| 2011/0124199 A1 | 5/2011 | Granneman et al. | |
| 2012/0091522 A1 | 4/2012 | Ozaki et al. | |
| 2013/0034947 A1 | 2/2013 | Hong et al. | |
| 2016/0319422 A1 | 11/2016 | Kurita et al. | |
| 2017/0194204 A1* | 7/2017 | Sowa | H01L 21/76846 |

(Continued)

FOREIGN PATENT DOCUMENTS

CN            109778143 B       5/2021

OTHER PUBLICATIONS

PCT Invitation to Pay Additional Fees and, Where Applicable, Protest Fee dated Mar. 21, 2022 in International Application No. PCT/US2022/070347.

(Continued)

*Primary Examiner* — Walter H Swanson
(74) *Attorney, Agent, or Firm* — Knobbe, Martens, Olson & Bear, LLP

(57) ABSTRACT

The disclosed technology relates generally to semiconductor manufacturing, and more particularly to precursor delivery in cyclic deposition. In one aspect, a method of depositing a thin film comprises alternatingly exposing a substrate in a thin film deposition chamber to a plurality of precursors. Exposing the substrate comprises introducing one of the precursors into the thin film deposition chamber through two or more atomic layer deposition (ALD) valves each configured to supply the one of the precursors.

21 Claims, 12 Drawing Sheets

(56) References Cited

U.S. PATENT DOCUMENTS

| | | |
|---|---|---|
| 2017/0323782 A1 | 11/2017 | Suzuki et al. |
| 2020/0087789 A1 | 3/2020 | Mustafa et al. |
| 2021/0013042 A1 | 1/2021 | Väyrynen et al. |
| 2021/0050182 A1 | 2/2021 | Kang |
| 2021/0217584 A1 | 7/2021 | Kuyel |
| 2022/0037126 A1* | 2/2022 | Sun .................. C23C 16/30 |

OTHER PUBLICATIONS

Sinha et al., "Area selective atomic layer deposition of titanium dioxide: Effect of precursor chemistry", J. Vac. Sci. Technol. B 24, 2523 (2006); doi: 10.1116/1.2359728.
Swagelok—ALD Diaphragm, "Bellows- and Diaphragm-Sealed Valves", © 2017 Swagelok Company, MS-02-301, RevL, pp. 572-578.
Swagelok—TM Swagelok Company, "ALD3 Diaphragm Valve Technical Report", www.swagelok.com, © 2004-2010 Swagelok Company, Jul. 2010, R4, MS-06-106-E, in 9 pages.
Swagelok—TM Swagelok Company, "ALD6 Diaphragm Valve Technical Report", www.swagolok.com, © 2006, 2007, 2009 Swagelok Company, MS-06-22-E, Aug. 2009, R2, in 6 pages.
Swagelok—TM Swagelok Company, "Valve Sizing—Technical Bulletin", www.swagelok.com, © 1994, 1995, 2000, 2002 Swagelok Company, Dec. 2007, R4, MS-06-84-E, in 12 pages.
Swagelok—TM Swagelok Company, "Ultrahigh-Purity Valves for Atomic Layer Processing", www.swagelok.com, © 2019 Swagelok Company, MS-02-301, RevO, Dec. 2019, in 13 pages.
International Search Report and Written Opinion dated Jun. 8, 2022 in corresponding Application No. PCT/US2022/070347, 26 pages.

\* cited by examiner

PRECURSOR DELIVERY SYSTEM AND METHOD FOR CYCLIC DEPOSITION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the priority benefit under 35 U.S.C. § 119(e) to U.S. Provisional Patent Application No. 63/142,238, filed Jan. 27, 2021, entitled "PRECURSOR DELIVERY SYSTEM AND METHOD FOR CYCLIC DEPOSITION," the content of which is hereby expressly incorporated by reference in its entirety.

BACKGROUND

Field

The disclosed technology relates generally to semiconductor manufacturing, and more particularly to precursor delivery in cyclic deposition.

Description of the Related Art

As semiconductor devices continue to scale in lateral dimensions, there is a corresponding scaling of vertical dimensions of the semiconductor devices, including thickness scaling of the functional thin films such as electrodes and dielectrics. Semiconductor fabrication involves various thin films that are deposited and patterned throughout the process flow. The thin films employed in semiconductor fabrication can be formed using various techniques, including wet and dry deposition methods. Wet deposition methods include, e.g., aerosol/spray deposition, sol-gel method and spin-coating. Dry deposition methods include physical vapor-based techniques, e.g., physical vapor deposition (PVD) and evaporation. Dry deposition methods additionally include precursor and/or chemical reaction-based techniques, e.g., chemical vapor deposition (CVD) and cyclic deposition such as atomic layer deposition (ALD).

SUMMARY

In one aspect, a thin film deposition system comprises a thin film deposition chamber configured to deposit a thin film by alternatingly exposing a substrate to a plurality of precursors. The thin film deposition system is configured to introduce a first one of the precursors into the thin film deposition chamber by independently actuating two or more first atomic layer deposition (ALD) valves connected in parallel to a common gas distribution plate for supplying the first one of the precursors into the thin film deposition chamber.

In another aspect, a method of depositing a thin film comprises alternatingly exposing a substrate in a thin film deposition chamber to a plurality of precursors. Alternatingly exposing the substrate comprises introducing one of the precursors into the thin film deposition chamber through two or more atomic layer deposition (ALD) valves each configured to supply the one of the precursors, wherein the two or more first atomic layer deposition (ALD) valves are connected in parallel to a common gas distribution plate for supplying the one of the precursors into the thin film deposition chamber.

In another aspect, a method of depositing a thin film comprises alternatingly exposing a substrate in a thin film deposition chamber to a plurality of precursors in a plurality of cycles. Alternatingly exposing the substrate comprises introducing a first one of the precursors into the thin film deposition chamber by independently actuating two or more first atomic layer deposition (ALD) valves connected in parallel to a common gas distribution plate for supplying the first one of the precursors into the thin film deposition chamber. Independently actuating the two or more first ALD valves comprises simultaneously opening the two or more first ALD valves for at least part of the time during introducing the first one of the precursors into the thin film deposition chamber during a same one of the cycles.

In another aspect, a method of depositing a thin film comprises alternatingly exposing a substrate in a thin film deposition chamber to a plurality of precursors in a plurality of cycles. Alternatingly exposing the substrate comprises introducing a first one of the precursors into the thin film deposition chamber by independently actuating two or more first atomic layer deposition (ALD) valves connected in parallel to a common gas distribution plate for supplying the first one of the precursors into the thin film deposition chamber. Independently actuating the two or more first ALD valves comprises actuating a first one of the two or more first ALD valves during a first one of the cycles and actuating a second one of the two or more first ALD valves during a second one of the cycles.

In another aspect, a method of depositing a thin film comprises alternatingly exposing a substrate in a thin film deposition chamber to a plurality of precursors in a plurality of cycles. Alternatingly exposing the substrate comprises introducing a first one of the precursors into the thin film deposition chamber by independently actuating two or more first atomic layer deposition (ALD) valves connected in parallel to a common gas distribution plate for supplying the first one of the precursors into the thin film deposition chamber. Independently actuating the two or more first ALD valves comprises exposing the substrate in a plurality pulses by alternatingly opening different ones of the two or more first ALD valves during a same one of the cycles.

DETAILED DESCRIPTION

Figure 1:
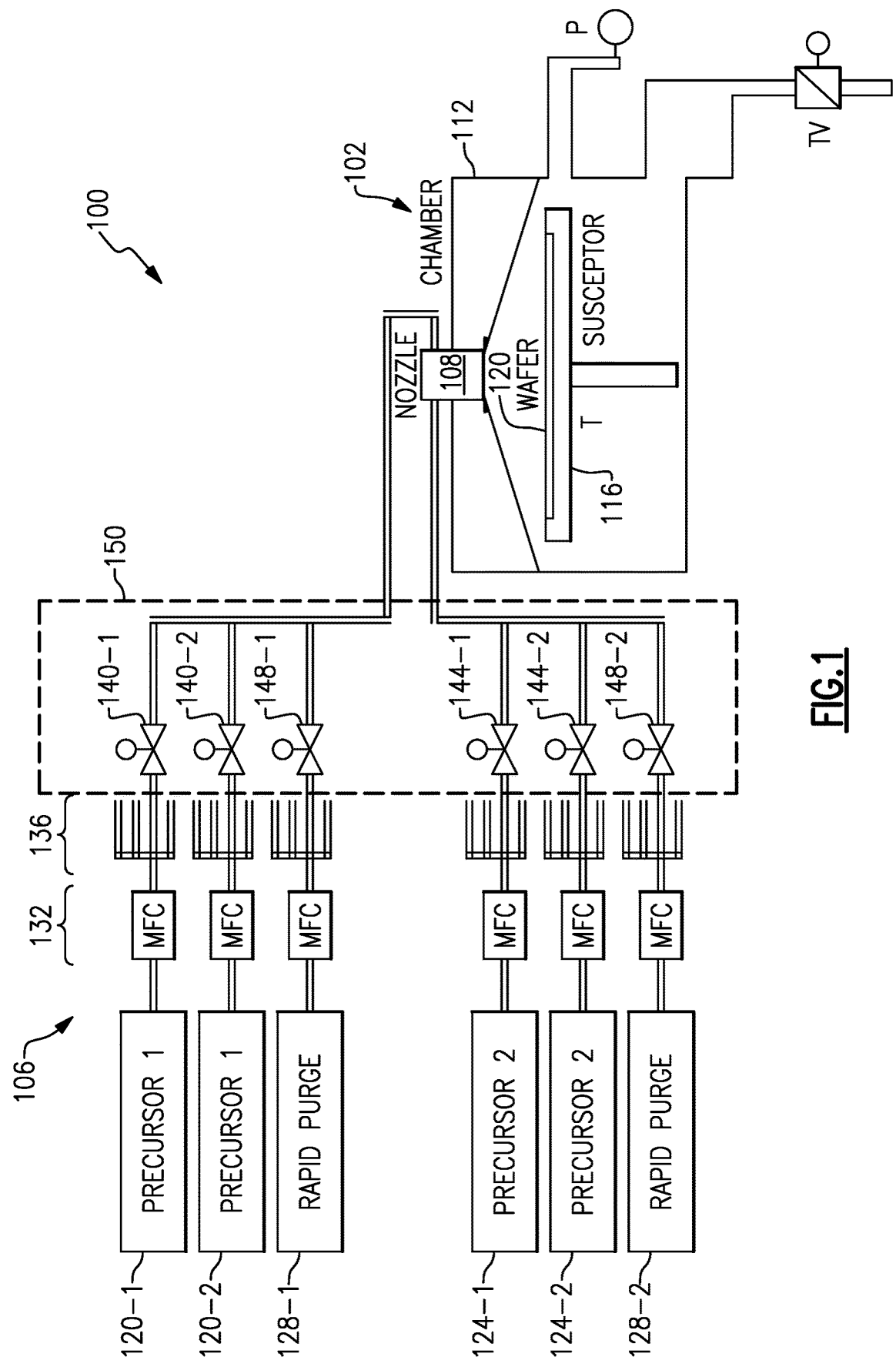
FIG. 1 schematically illustrates a thin film deposition system including a thin film deposition chamber and a precursor delivery system configured to deliver a precursor using two or more atomic layer deposition (ALD) valves connected in parallel to a common gas distribution plate, according to embodiments.

Cyclic deposition processes such as atomic layer deposition (ALD) processes can provide a relatively conformal thin films on relatively high aspect-ratio (e.g., 2:1) structures with high uniformity and thickness precision. While generally less conformal and uniform compared to ALD, thin films deposited using continuous deposition processes such as chemical vapor deposition (CVD) can provide higher productivity and lower cost. ALD and CVD can be used to deposit a variety of different films including elemental metals, metallic compounds (e.g., TiN, TaN, etc.), semiconductors (e.g., Si, III-V, etc.), dielectrics (e.g., $SiO_2$, AlN, $HfO_2$, $ZrO_2$, etc.), rare-earth oxides, conducting oxides (e.g., $IrO_2$, etc.), ferroelectrics (e.g., $PbTiO_3$, $LaNiO_3$, etc.), superconductors (e.g., $Yba_2Cu_3O_{7-x}$), and chalcogenides (e.g., GeSbTe), to name a few.

Some cyclic deposition processes such as atomic layer deposition (ALD) include alternatingly exposing a substrate to a plurality of precursors to form a thin film. The different precursors can alternatingly at least partly saturate the surface of the substrate and react with each other, thereby forming the thin film in a layer-by-layer fashion. Because of the layer-by-layer growth capability, ALD can enable precise control of the thickness and the composition, which in turn can enable precise control of various properties such as conductivity, conformality, uniformity, barrier properties and mechanical strength. Because of the nature of deposition process in ALD, the precursor delivery systems of ALD deposition systems face unique challenges compared to, e.g., the precursor delivery systems of CVD deposition systems. For example, because the alternating exposures of the substrate to multiple precursors are repeatedly carried out at a relatively high speed and/or at a relatively high frequency, precursor delivery systems or components thereof such as precursor delivery valves can directly or indirectly pose limitations to various aspects of the ALD deposition processes, including precision, throughput, reliability and operating cost thereof.

As described herein, an atomic layer deposition (ALD) valve refers to a precursor delivery valve configured for introducing a precursor into an ALD deposition chamber in pulses with high precision and speed (e.g., a response time less than 30 ms) while having a high flow coefficient (e.g., $C_v$ exceeding 0.20). Because deposition of a thin film by ALD may involve from few to as much as thousands of cycles of alternating exposures to different precursors, valve parameters such as the flow rate, speed and/or frequency of the ALD valves can directly impact deposition throughput as well as the efficiency of precursor use. In addition, the wear of ALD valves can limit the service life of some ALD systems between preventive maintenance services. Some precursors, which are delivered at elevated temperatures, can further limit the throughput and service life of some ALD systems.

Thus, there is a need for precursor delivery systems for improved throughput and speed, longer time-to-fail, better temperature compatibility, and lower maintenance. These capabilities could dramatically reduce the overall cost of manufacturing as well as the cost of ownership of ALD systems.

Precursor Delivery System with Two or More ALD Valves for Delivering the Same Precursor To address the above-mentioned needs among others, a thin film deposition system according to embodiments comprises a thin film deposition chamber configured to deposit a thin film by alternatingly exposing a substrate to a plurality of precursors, wherein the thin film deposition chamber is configured to introduce one or more of the precursors into the thin film deposition chamber using two or more atomic layer deposition (ALD) valves for the same ones of the precursors. The configuration allows, e.g., a combined flow rate of the one or more precursors through the two or more ALD valves that is much higher than conventional thin film deposition systems, such that a duration of an ALD cycle can be significantly reduced. For example, the duration of exposure to a precursor can be reduced in proportion to the number of ALD valves employed to introduce the same precursor. For example, by employing n number of ALD valves to introduce a given precursor, the exposure time can be reduced roughly by the same factor of n, while achieving similar levels of surface saturation that would be achieved using just one ALD valve.

In the following, embodiments may be described using specific precursors for specific films by way examples. For example, specific example precursors including $TiCl_4$, $NH_3$ and $SiCl_2H_2$ for depositing TiN and/or TiSiN may be used to describe the thin film deposition system and a method of depositing a thin film according to various embodiments. However, it will be understood that embodiments are not so limited, and the inventive aspects can be applied to any suitable combination of precursors for depositing any suitable thin film that can be formed using cyclic deposition processes such as ALD.

FIG. 1 schematically illustrates a thin film deposition system configured to deliver a gas using two or more atomic layer deposition (ALD) valves connected in parallel to a common gas distribution plate, according to embodiments. The thin film deposition system 100 includes a thin film deposition chamber 102 and a precursor delivery system 106 configured to deliver a plurality of precursors into the deposition chamber 102. The illustrated deposition chamber 102 is configured to process a substrate 120 on a support 116, e.g., a susceptor, under a process condition. The deposition chamber 102 additionally includes a nozzle 108 configured to centrally discharge the plurality of precursors into the deposition chamber 102 through a gas distribution plate 112, also referred to as a showerhead. The nozzle 108 may mix the gases, e.g., a precursor and a purge gas, prior to being diffused into the deposition chamber 102 by the gas distribution plate 112. The gas distribution plate 112 is configured to uniformly diffuse the precursor(s) over the substrate 120 on the susceptor 116 so that a uniform deposition occurs. The deposition chamber may be equipped with pressure monitoring sensors (P) and/or temperature monitoring sensors (T).

The precursor delivery system 106 is configured to deliver a plurality of precursors from precursor sources (120, 124) and one or more purge gases, e.g., inert gases, from purge gas sources (128) into the process chamber. Each of the precursors and purge gases is connected to the deposition chamber 102 by a respective gas delivery line. The gas delivery lines additionally include in their paths mass flow controllers (MFCs) 132 and respective precursor valves for introducing respective precursors into the thin film deposition chamber. At least some of the valves can be atomic layer deposition (ALD) valves. The gas delivery lines are connected to the deposition chamber 102 through the gas distribution plate 112.

Advantageously, according to various embodiments, the thin film deposition system 100 is configured such that at least one of the precursors can be introduced into the deposition chamber 102 by independently actuating two or more first atomic layer deposition (ALD) valves connected in parallel to the gas distribution plate 112 for supplying the one of the precursors into the thin film deposition chamber 102.

For illustrative purposes only, in the illustrated configuration of FIG. 1, the plurality of precursors include a first precursor and a second precursor. The first precursor is stored in at least two first precursor sources 120-1, 120-2, and the second precursor is stored in at least two second precursor sources 124-1, 124-2. A purge gas can be stored in at least two purge gas sources 128-1, 128-2. The first precursor is configured to be delivered from the first precursor sources 120-1, 120-2 by independently actuating two respective first precursor atomic layer deposition (ALD) valves 140-1, 140-2 that are connected in parallel to the common gas distribution plate 112. Additionally, the second precursor is configured to be delivered from the second precursor sources 124-1, 124-2 by independently actuating two respective second precursor atomic layer deposition (ALD) valves 144-1, 144-2 that are connected in parallel to the common gas distribution plate 112. Additionally, the purge gas is configured to be delivered from the purge gas sources 128-1, 128-2 by independently actuating two respective purge gas atomic layer deposition (ALD) valves 148-1, 148-2 that are connected in parallel to the common gas distribution plate 112. The ALD valves 140-1, 140-2, 144-1, 144-2, 148-1 and 148-2 and the respective delivery lines connected to the gas distribution plate 112 can be arranged to feed the respective gases into the nozzle 108 through a multivalve block assembly 150 (FIG. 3A), which may be attached to a lid of the deposition chamber 102. In the illustrated configuration, the ALD valves 140-1, 140-2, 144-1, 144-2, 148-1 and 148-2 are final valves before the respective gases are introduced into the deposition chamber 102.

As configured, the thin film deposition system 100 is configured to deliver a precursor and/or a purge gas through two or more separate gas lines and using independently controlled respective ALD valves. The delivery pulses of the same precursor and/or the purge gas can overlap or not overlap temporally, depending on the embodiment.

By way of example only, the first and second precursors can include $TiCl_4$ and $NH_3$, respectively, that are delivered into the deposition chamber 102 from respective $TiCl_4$ and $NH_3$ sources through respective precursor delivery lines to form, e.g., TiN. The precursor delivery system can additionally be configured to deliver Ar as the purge gas into the process chamber from Ar sources through purge gas delivery lines. Purge gases may be delivered as a continuous purge (CP) gas, which may be delivered through precursor ALD valves, and/or as a rapid purge (RP) gas, which may be delivered through dedicated purge gas ALD valves as shown in FIG. 1. The illustrated precursor delivery system 100 can be configured to deliver Ar as an RP gas into the process chamber 102 from the purge gas sources 128-1, 128-2 through respective purge gas delivery lines and purge gas ALD valves 148-1, 148-2.

According to various embodiments, the thin film deposition system 100 is configured for thermal ALD without an aid of plasma. While plasma-enhanced processes such as plasma enhanced atomic layer deposition (PE-ALD) may be effective in forming conformal films on surfaces having relatively low aspect ratios, such processes may not be effective in depositing films inside vias and cavities having relative high aspect ratios. Without being limited by theory, one possible reason for this is that a plasma may not reach deeper portions of high aspect ratio vias under some circumstances. In these circumstances, different portions of the vias may be exposed to different amounts of the plasma, leading to undesirable structural effects arising from non-uniform deposition, such as thicker films being deposited near the opening of the via compared to deeper portions (sometimes called cusping or keyhole formation). For these reasons, a thermal cyclic vapor deposition such as thermal ALD may be more advantageous, because such thermal processes do not depend on the ability of the plasma to reach portions of the surface being deposited on.

The illustrated precursor delivery system 100 advantageously provides, among other things, the capability to provide a combined flow rate using two or more ALD valves, by overlapping activation of the two or more ALD valves, of a given precursor that is much higher than conventional thin film deposition systems. By doing so, a duration of an ALD cycle can be significantly reduced, a flow rate of a gas during an ALD cycle can be significantly increased, or both. For example, the duration of exposure to a precursor can be reduced in proportion to the number of ALD valves employed to introduce the same precursor. Furthermore, by overlapping activation of the two or more ALD valves, the pressure inside the deposition chamber 102 during the exposure can advantageously be increased to levels not attainable with a single ALD valve, e.g., >1 Torr.

Additionally or alternatively, the illustrated precursor delivery system 100 advantageously provides the capability, by rapidly alternating activation of two or more ALD valves, for delivering the given precursor using repeated pulsing of a given precursor within the same subcycle with less dead time between pulses.

Additionally or alternatively, the illustrated precursor delivery system 100 advantageously provides the capability, by alternatingly activating of two or more ALD valves, the wear out of the ALD valves can be proportionally reduced, thereby reducing the frequency of preventive maintenance that may be needed for replacement or repair of the ALD valves.

Figure 2:
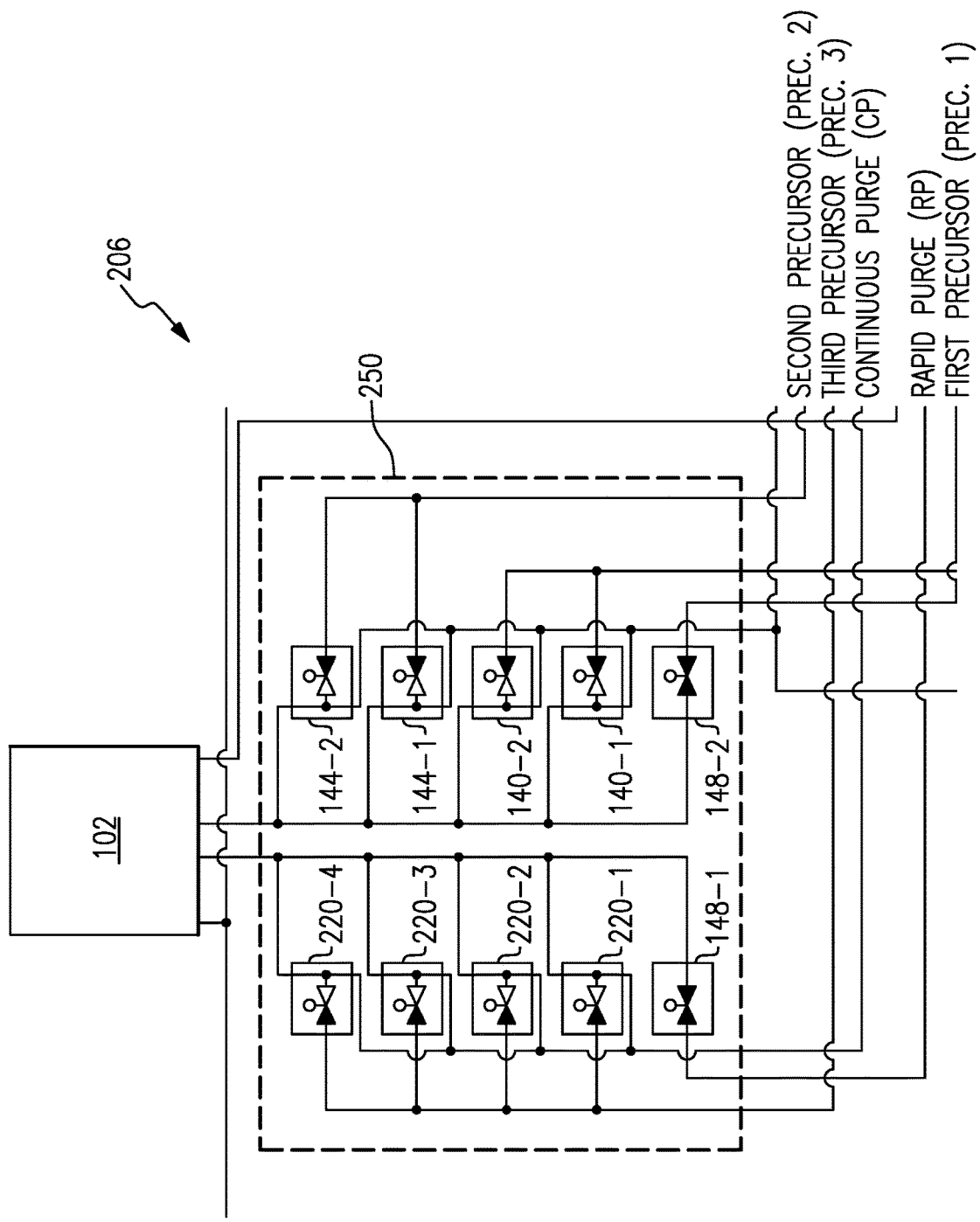
FIG. 2 is a schematic of a precursor delivery system configured to deliver a precursor using two or more atomic layer deposition (ALD) valves connected in parallel to a common gas distribution plate, according to embodiments.

FIG. 2 is a schematic of a precursor delivery system configured to deliver a precursor using two or more atomic layer deposition (ALD) valves connected in parallel to a common gas distribution plate, according to embodiments. The precursor delivery system 206 is connected to a deposition chamber 102 in a similar manner as the precursor delivery system 106 illustrated in FIG. 1, according to embodiments. The deposition chamber 102 is configured to deliver three precursors through eight precursor ALD valves 140-1, 140-2, 144-1, 144-2, 220-1, 220-2, 220-3, 220-4 and a purge gas, e.g., an inert gas, through two purge gas ALD valves 144-1, 144-2, where each of the three precursors and the purge gas are delivered via respective ones of two or more precursor and purge gas ALD valves. In particular, by way of example only, the illustrated precursor system 206 can be configured to deliver $TiCl_4$ through two precursor ALD valves, $SiCl_2H_2$ through two precursor ALD valves and $NH_3$ through four precursor ALD valves. The precursor system 206 can also be configured to deliver an inert gas, e.g., Ar, through two or more purge ALD valves. In particular, by way of example only, the illustrated precursor delivery system 206 is configured to for forming a thin film comprising any of Ti, Si and N, e.g., TiN, TiSi or TiSiN. For example, the system 206 is configured to deliver a first precursor (Prec. 1), e.g., $TiCl_4$, through two first precursor ALD valves 140-1, 140-2, a second precursor (Prec. 2), e.g., $SiCl_2H_2$, through two second precursor ALD valves 144-1, 144-2 and a third precursor (Prec. 3), e.g., $NH_3$, through four third precursor ALD valves 220-1, 220-2, 220-3, 220-4. The precursor delivery system 206 is additionally configured to deliver a purge gas, e.g., $N_2$ or Ar, through two purge ALD valves 144-1, 144-2. The ALD valves and the respective delivery lines connected thereto can be arranged to feed the respective precursor and purge gases into the deposition chamber 102 through a multivalve block assembly 250, which may be attached to a lid of the deposition chamber 102.

It will be appreciated that each of the illustrated precursor ALD valves 140-1, 140-2, 144-1, 144-2, 220-1, 220-2, 220-3, 220-4 is configured as a three-port valve configured to simultaneously receive a continuous purge (CP) gas and a precursor gas into respective inlets ports and output the CP gas and the precursor gas from an outlet port and into the deposition chamber 102. For example, a CP purge gas, e.g., Ar or $N_2$, enters through one inlet (first) port and exits through an exit outlet (second) port. A precursor gas enters through another inlet (third) port and also exits through the exit outlet (second) port. The inlet ports are small, precise orifices that delivers a relatively small chemical volume. This three-port configuration can deliver a steady flow of CP gas into the process station while pulsing a precursor gas. The CP gas serves to continuously purge the respective delivery lines, facilitate the movement the precursor into the deposition chamber, and to control the overall process pressure during deposition. On other hand, each of the illustrated purge gas ALD valves 148-1, 148-2 is configured as a two-port valve configure to receive a rapid purge (RP) gas into an inlet port and output the RP gas into the deposition chamber 102. As configured, the purge gas can be delivered as a continuous purge (CP) gas, through each of the illustrated precursor ALD valves 140-1, 140-2, 144-1, 144-2, 220-1, 220-2, 220-3, 220-4, and/or as a rapid purge (RP) gas, through each of the illustrated purge gas ALD valves 148-1, 148-2. The inventors have found that the capability to flow CP through the precursor ALD valves can enable, among other things, shorter RP pulses durations needed to purge the delivery lines, thereby improving the overall speed and throughput.

Figure 3A:
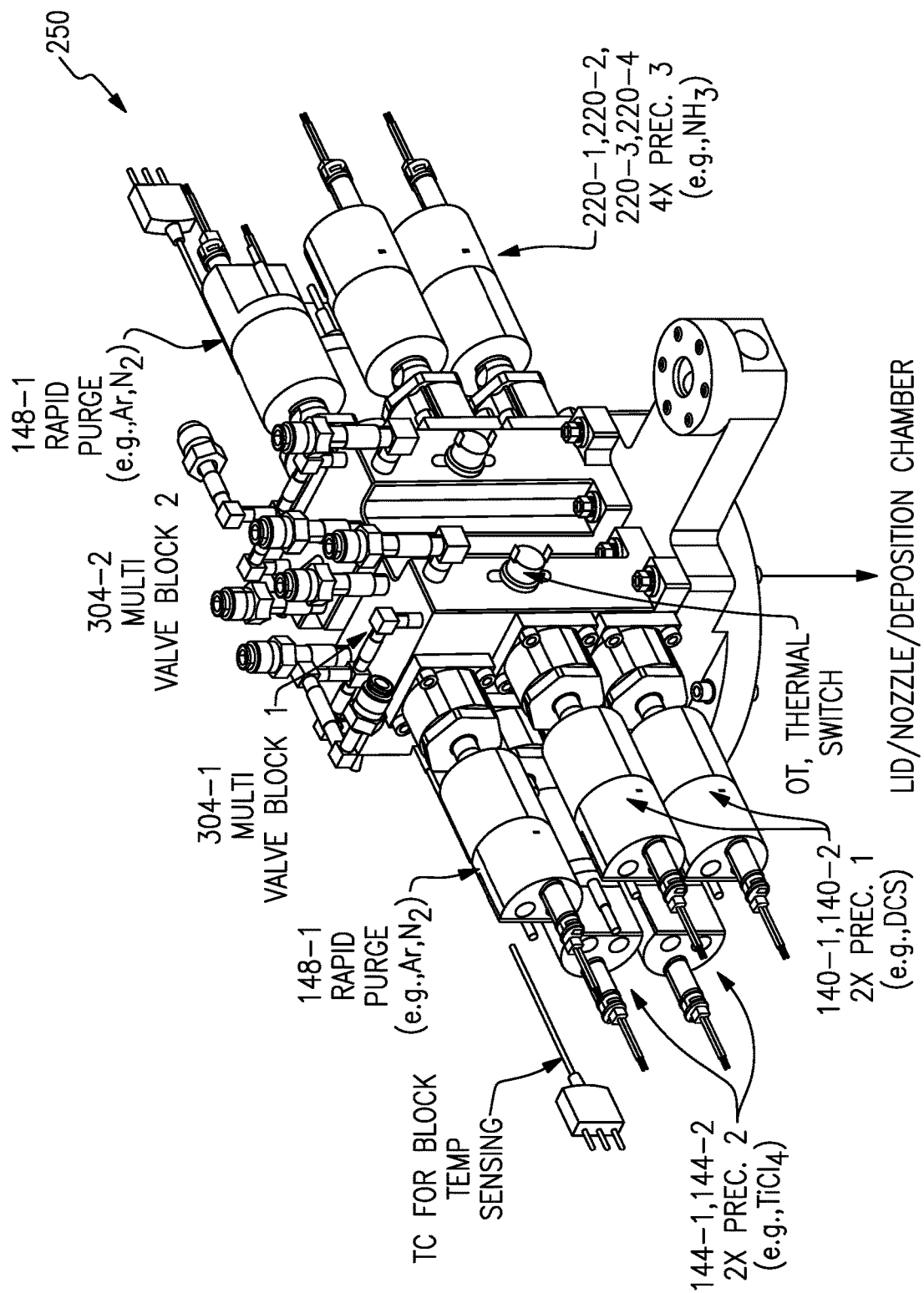
FIG. 3A shows a perspective view of a multivalve block assembly for a precursor delivery system configured to deliver a precursor using two or more ALD valves connected in parallel to a common gas distribution plate, according to embodiments.

FIG. 3A shows a perspective view of a multivalve block assembly for a precursor delivery system configured to deliver a precursor using two or more atomic layer deposition (ALD) valves connected in parallel to a common gas distribution plate, according to embodiments. The multivalve block assembly 250, which corresponds to the multivalve block assembly 250 schematically depicted in FIG. 2, similarly corresponds to the multivalve block assembly 150 schematically depicted in FIG. 1. The multivalve block assembly 250 is divided into two halves, each comprising one of first and second multivalve blocks 304-1, 304-2. Each of first and second multivalve blocks 304-1, 304-2 has connected thereto a plurality of ALD valves. In the illustrated embodiment, the first multivalve block 304-1 is configured to deliver a first precursor (Prec. 1), e.g., $TiCl_4$, through two first precursor ALD valves 140-1, 140-2 connected thereto, and a second precursor (PreC2), e.g., $SiCl_2H_2$, through two second precursor ALD valves 144-1, 144-2 connected thereto. The first multivalve block 304-1 is further configured to deliver a purge gas, e.g., $N_2$ or Ar, through a first purge gas ALD valve 148-1 connected thereto. The second multivalve block 304-2 is configured to deliver a third precursor (Prec. 3), e.g., $NH_3$, through four precursor ALD valves 220-1, 220-2, 220-3, 220-4 connected thereto. The second multivalve block 304-2 is further configured to deliver a purge gas, e.g., $N_2$ or Ar, through a second purge gas ALD valve 148-2 connected thereto. Thus configured, multivalve block assembly 250 comprises two or more atomic layer deposition (ALD) valves configured to deliver the same precursor for three precursors and a purge gas, according to embodiments. The illustrated multiblock assembly 250 has coupled thereto 10 ALD valves. However, embodiments are not so limited and the number of ALD valves can be greater or fewer than 10.

Still referring to FIG. 3A, the multivalve block assembly 250 is connected at the bottom to a central region of a top surface of a lid of the deposition chamber 102 (FIG. 1). The top surface of the lid is physically outside the deposition chamber 102. As configured, the multivalve block assembly 250 is configured to position the ALD valves directly above a central region of the substrate inside the deposition chamber 102. The precursor and purge gas ALD valves are connected to the multivalve block assembly 250 disposed outside of the thin film deposition chamber 102, and the multiblock assembly 250 is configured to serve as a hub to receive and introduce the precursors and the purge gas into the thin film deposition chamber 100 (FIG. 2) through the respective ALD valves. Inside the process chamber, the lid has attached thereon a nozzle 108 (FIG. 1), which is in turn connected to a gas distribution plate 112 (FIG. 1), also referred to as a showerhead, configured to diffuse the precursor(s) over a substrate 120 (FIG. 1) on the susceptor 116 (FIG. 1).

Figure 3B:
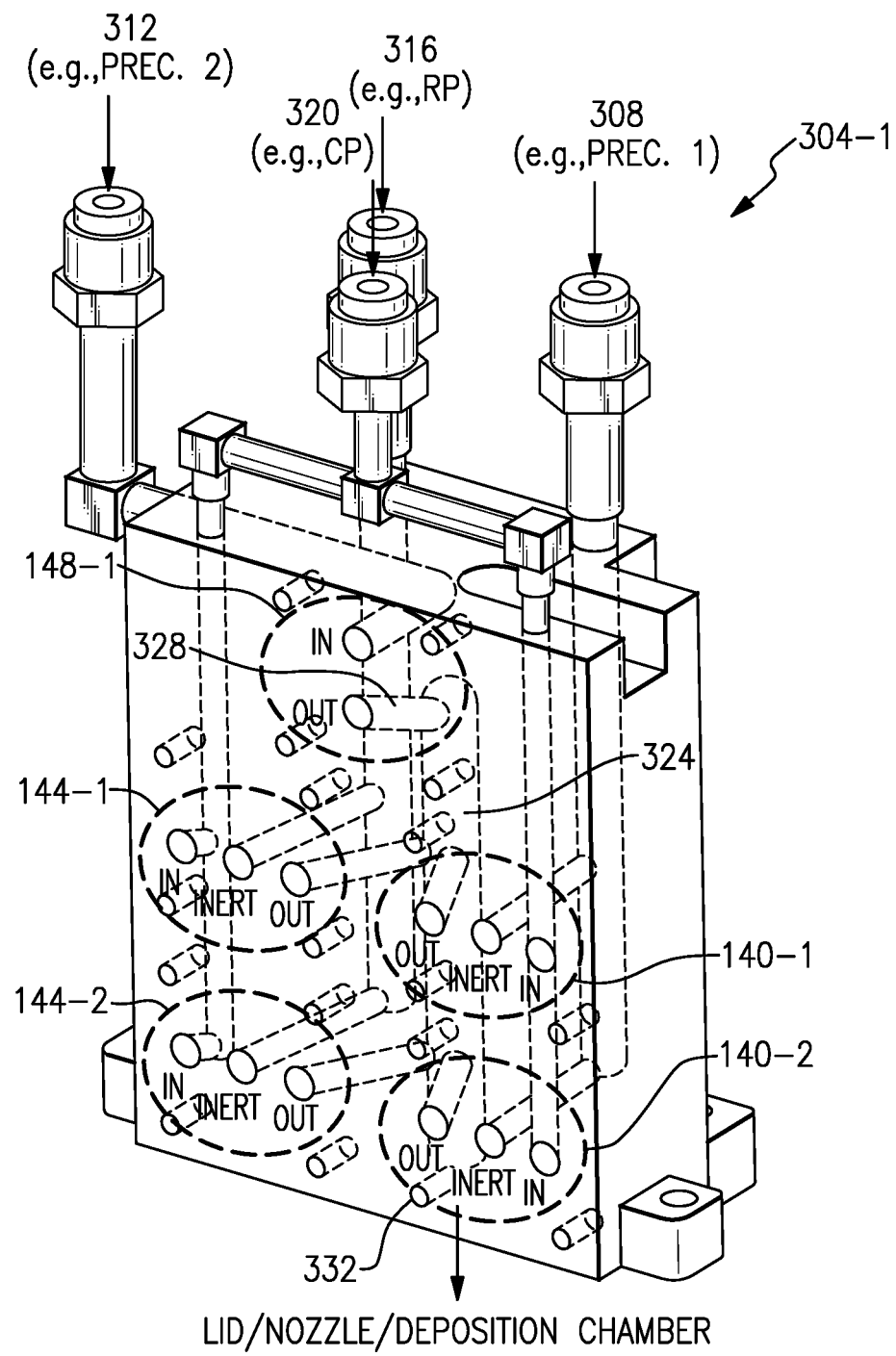
FIG. 3B shows a perspective view of one of the multivalve blocks illustrated in FIG. 3A configured to couple a plurality of ALD valves connected in parallel to a common gas distribution plate, according to embodiments.

FIG. 3B shows a perspective view of one of the multivalve blocks illustrated in FIG. 3A configured to couple a plurality of ALD valves connected in parallel to a common gas distribution plate, according to embodiments. A multivalve block, which may be a solid block having conduits or channels formed therein, is disposed outside of the thin film deposition chamber 102 (FIGS. 1, 2) and serves as a hub to receive the first one of the precursors and channel the precursors and purge gas through internal conduits or channels defined therein. In particular, FIG. 3B shows a perspective view of the first multivalve block 304-1 illustrated in FIG. 3A. For clarity, the first multivalve block 304-1 is shown without the ALD valves attached thereto. Instead, the attachment locations are denoted by dotted line circles for the two first precursor ALD valves 140-1, 140-2 configured for delivering the first precursor (Prec. 1), e.g., TiCl$_4$, the two second precursor ALD valves 144-1, 144-2 configured for delivering the second precursor (Prec. 2), e.g., SiCl$_2$H$_2$, and the first purge gas ALD valve 148-1 configured for delivering the inert gas. Each of the attachment locations for the two first precursor ALD valves 140-1, 140-2 and the two second precursor ALD valves 144-1, 144-2 includes an inlet (IN), outlet (OUT) and an inert gas inlet (INERT). Unlike precursor ALD valves, which are three-port ALD valves as described above, the attachment location for the first purge gas ALD valve 148-1, which is a two-port ALD valve as described above, includes an inlet (IN) and an outlet (OUT) while an inert gas inlet is omitted.

The first multivalve block 304-1 includes a plurality of gas input ports 308, 312, 316, 320 for receiving the precursors and purge gases. In the illustrated configuration, the input ports 308 and 312 are configured for feeding the first precursor (Prec. 1), e.g., TiCl$_4$, and the second precursor (Prec. 2), e.g., SiCl$_2$H$_2$, similar to the configurations shown in FIGS. 2 and 3A. In addition, the inputs ports 316, 320 are configured for feeding a purge gas, e.g., N$_2$ or Ar, for delivery as rapid purge (RP) and continuous purge (CP) gases, respectively. While not shown, the second multivalve block 304-2 may be similarly configured, except for the third precursor (Prec. 3) feeding into the two precursor input ports 308 and 312. Of course, the input ports are not limited to the illustrated configuration and there may be additional or fewer input ports, depending on the number of gases and the number of delivery lines/ALD valves per gas desired.

Still referring to FIG. 3B, upon entry through the input ports 308, 312, 316, 320, the respective precursor and purge gases are routed through respective conduits before being introduced into the respective ALD valves. Each of the precursors enters the respective one of the ALD valves 140-1, 140-2, 144-1, 144-2 through the respective inlets. The CP gas enters each of the precursor ALD valves 140-1, 140-2, 144-1, 144-2 through respective ones of the purge gas inlet (INERT). The respective ones of the precursors and the CP gas exit through the respective ones of the outlets (OUTs) and travels through respective ones of outlet conduits 328 before introduced into a central conduit 324 extending in a vertical direction, before exiting the first multivalve block 304-1 though a central outlet 332, into the deposition chamber 102 (FIGS. 1 and 2), e.g., through the nozzle 108 (FIG. 1) and the gas distribution plate 112 (FIG. 1).

The central conduit 324, which may be disposed over a central region of a substrate 120 (FIG. 1), is configured to merge the precursors and the purge gas from multiple ALD valves before being introduced into the deposition chamber through, e.g., the nozzle 108 (FIG. 1) prior to being distributed by the gas distribution plate 112 (FIG. 1). Thus, in the illustrated configuration, the central conduit 324 is the final conduit before the precursors and purge gas are introduced into the deposition chamber 102. The inventors have discovered that the configuration of multivalve block assembly 250 (FIG. 3A) including the centrally disposed position and the arrangement of the conduits can be critical for realizing various advantages, including fast precursor delivery times. For example, the inventors have discovered that the vertical position of the ALD valves, disposed vertically above the surface of the substrate 120 (FIG. 1) can be critical in achieving less than 1 second exposure time for substantially saturating the substrate surface with each precursor. As described herein, substantial saturation refers to a condition where increasing the exposure time does not substantially increase the growth rate. For example, for various materials, increasing the exposure time by 20%, 50%, 100%, or a value in a range defined by any of these values does not result in the growth rate increasing by more than 1%, 2%, 5%, 10% or a value in a range defined by any of these values.

In particular, still referring to FIG. 3B, among various design parameters, the inventors have discovered that the vertical positions of the outlets (OUT) of the precursor and purge gas ALD valves, which define the distances from the ALD valves to the central outlet 332, and the diameter of the central conduit 324, the combination of which defines the conductance of the central conduit 324, can be critical for reducing the residence time of the precursors from the ALD valves to the substrate. To reduce the precursor residence time, according to various embodiments, the vertical positions of the outlets (OUT) of the precursor and purge gas ALD valves relative to the central outlet 332 defining a bottom end of the central conduit 324, the maximum value of which is defined by the length of the central conduit 324, is less than 5", 4", 3", 2", 1" or has a value in a range defined by any of these values. In addition, the central conduit 324 has a diameter greater than 0.2", 0.30", 0.40", 0.50", 0.60" or a value in a range defined by any of these values. In the illustrated example, the length of the central conduit 324 is about 3.7" and the outlet of each of the precursor ALD valves 140-1, 140-2, 144-1 and 144-2 is disposed within about 2.0" of the central outlet 332. Because the OUT of the first purge ALD valve 148-1 for introducing rapid purge (RP) is disposed above the precursor ALD valves 140-1, 140-2, 144-1 and 144-2, the OUT of the first purge ALD valve 148-1 is disposed farther, within about 4" of the central outlet 332. In addition, the central conduit 324 has a diameter of 0.375".

The inventors have further discovered that the length of the outlet conduits 328, which define the conductance of the from the outlets (OUT) of the ALD valves to the central conduit 324, and the diameter of the outlet conduits 328, the combination of which defines the conductance of the outlet conduits 328, can also be critical for reducing the residence time of the precursors from the ALD valves to the substrate. To reduce the precursor residence time, according to various embodiments, the outlet conduits 328 can be designed to have a length less than 2", 1.5", 1", 0.5" or a value in a range defined by any of these values. In addition, the outlet conduits 328 have a diameter greater than 0.10", 0.20", 0.30", 0.40" or a value in a range defined by any of these values. In the illustrated example, the length and diameter of the outlet conduit 328 are 0.86" and 0.216", respectively.

Still referring to FIG. 3B, the inventors have further discovered that the numbers of bends in the overall lengths of the conduits between the input ports 308, 312, 316, 320, and the central outlet 332 can be kept low to improve the conductance through the conduits, and thereby improve the conductance and gas delivery time to the substrate. According to various embodiments, the number of bends do not exceed three, two or one. In the illustrated example, the number of bends in the each of the overall lengths of the conduits between the input ports 308, 312, 316, 320 and the central outlet 332 does not exceed four—two or three bend between the input ports 308, 312, 316, 320 and the respective IN of the ALD valves 140-1, 140-2, 144-1, 144-2, 148-1, and one bend between the respective OUT of the ALD valves and the central outlet 332.

Furthermore, the inventors have further discovered that it is advantageous to have the central vertical axis of the multivalve block 250, the central conduit 324 and/or the central outlet 332 (FIG. 3B), be aligned closely to the central positions of the lid of the deposition chamber and/or the substrate, to minimize the gas residence time and/or the gas delivery time to the substrate. According to various embodiments, a lateral offset between the central vertical axis of the multivalve block 250, the central conduit 324 and/or the central outlet 332 (FIG. 3B), and the central positions of the lid of the deposition chamber and/or the substrate, does not exceed 2", 1", 0.5", 0.25" or has a value in a range defined by any of these values.

Still referring to FIG. 3B, thus configured, multiple ALD valves configured to deliver the same gas (precursor or purge gas) can be commonly connected upstream to a common one of input ports 308, 312, 316, 320. After splitting into individual inlet conduits and feeding into respective ALD valves, each gas is delivered into the deposition chamber 102 (FIGS. 1, 2) through the common central conduit 324. Thus configured, two or more atomic layer deposition (ALD) valves connected to the first multivalve block 304-1 are advantageously configured to supply the same gas into the deposition chamber simultaneously or sequentially.

Figure 3C:
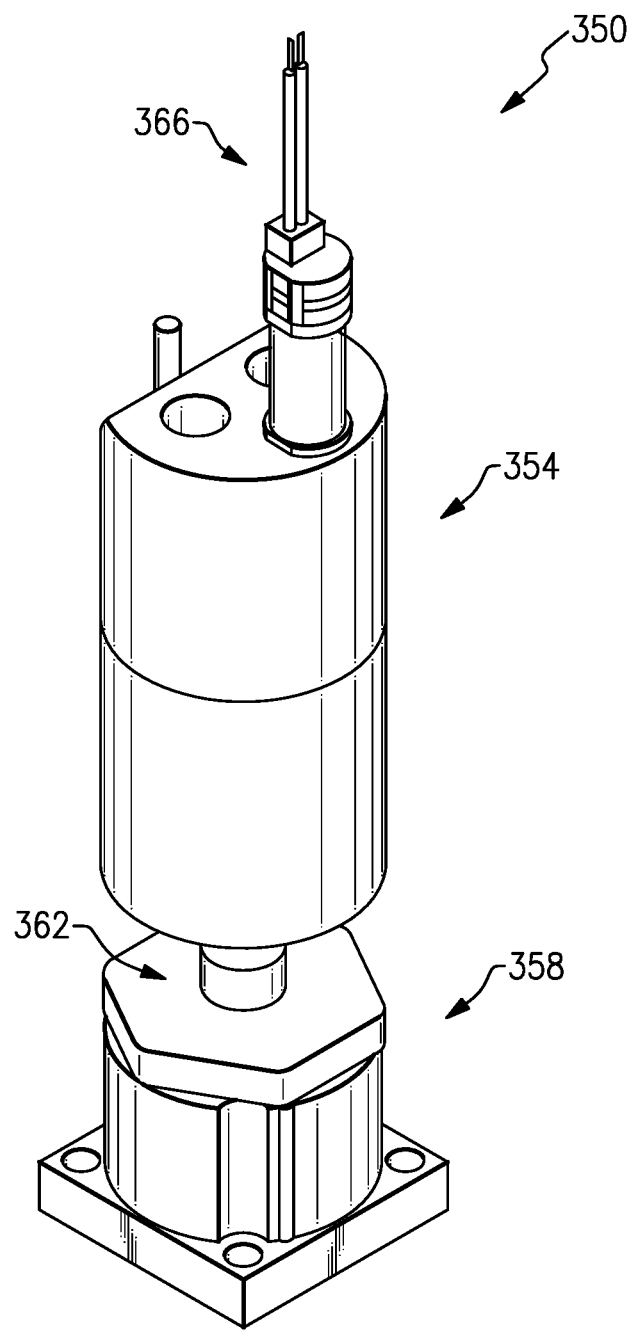
FIG. 3C shows a perspective view of one of the ALD valves configured to couple to the multivalve block illustrated in FIG. 3B, according to embodiments.

FIG. 3C shows a perspective view of one of the ALD valves configured to couple to the multivalve block illustrated in FIG. 3B, according to embodiments. The illustrated ALD valve 350 can represent one of the first precursor ALD valves 140-1, 140-2, the second precursor ALD valves 144-1, 144-2 and the purge gas ALD valve 148-1 described above with respect to FIGS. 3A and 3B, according to embodiments. The illustrated ALD valve 350 is divided into an upper part 354 and a lower part 358 coupled to a multivalve block such as that illustrated in FIG. 3B. The upper part 354 and the lower part 358 are connected by a coupling portion 362 pneumatically coupling the upper and lower parts 354, 358. The illustrated ALD valve 350 additionally includes a thermocouple unit 366 for temperature sensing and/or controlling. The upper part 354 includes a pneumatic actuator assembly including a solenoid pilot valve, among various other components. The lower part 358 includes a valve body part including a valve body, a valve diaphragm and a valve seat, among various other components. The position of the valve diaphragm can be monitored by a position sensor. As configured, the ALD valve 350 can be configured as a pilot-operated diaphragm solenoid valve. As described herein, a pilot-operated solenoid valve refers to a solenoid valve that uses a differential pressure of the medium over the valve ports to open and close the valve. A pilot-operated diaphragm solenoid valve employs the use of a small chamber directly above the diaphragm to assist in the operation of the valve. Process fluid is allowed to enter the chamber through a small orifice in the inlet port, and in a normally closed valve, compresses against the diaphragm and forces is against the seat to maintain the closing seal. Once current is applied to the pilot solenoid, the diaphragm is pulled upwards against the spring pressure, and the pilot fluid in the chamber is forced back through the orifice in the inlet port where it re-joins the main flow through the valve body. Pilot-operated diaphragm solenoid valves can operate with high speed (response time less than 30 msec.) In addition, pilot-operated diaphragm solenoid valves can provide relatively high flow rates and can operate at higher pressure and temperature ranges, with lower power consumption, compared to direct-acting solenoid valves.

Figure 3D:
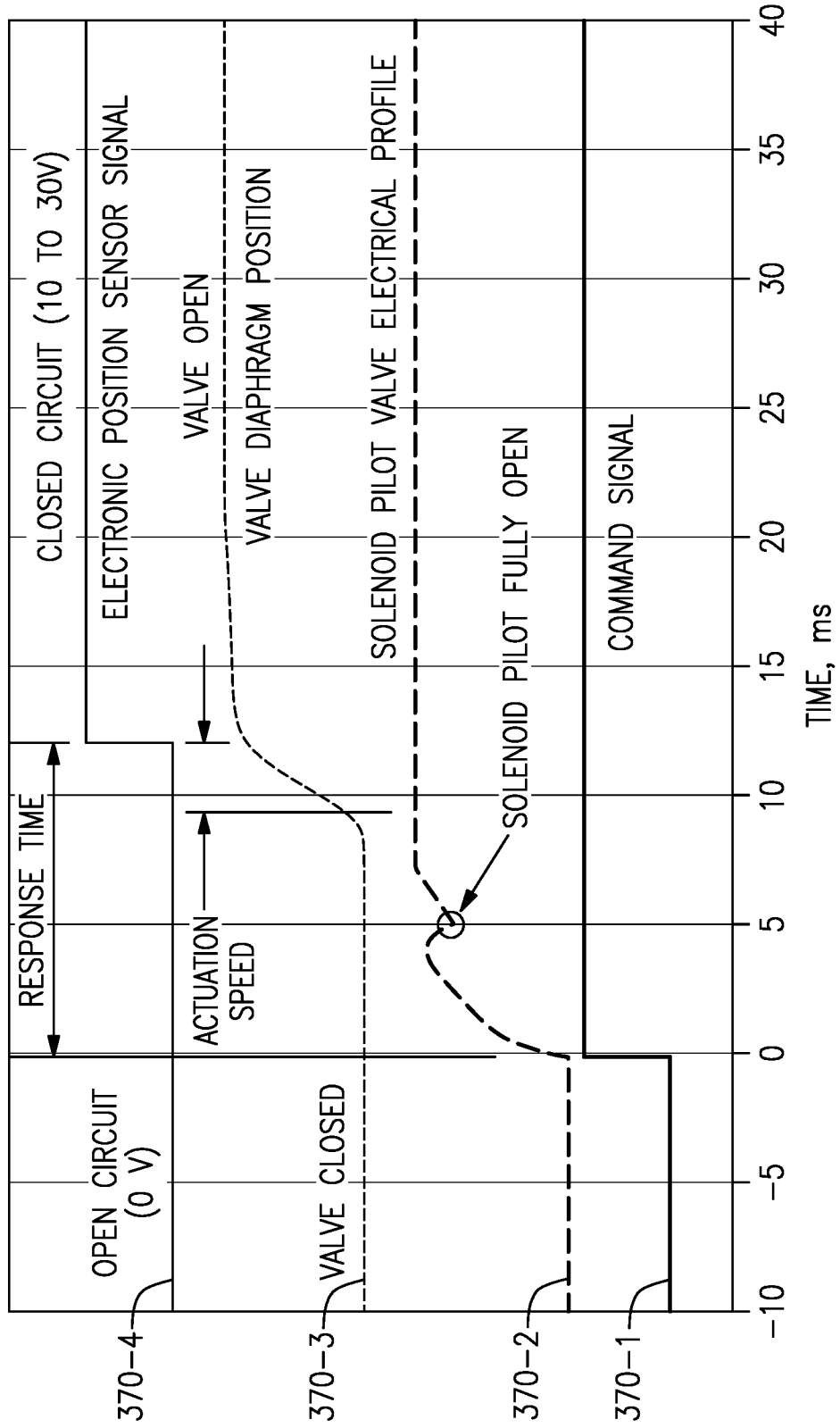
FIG. 3D is an example experimental chart illustrating various signals associated with actuation of an ALD valve such as the one illustrated in FIG. 3C, according to embodiments.

FIG. 3D is an example experimental chart illustrating various signals associated with actuation of an ALD valve such as the one illustrated in FIG. 3C, according to embodiments. The experimental chart illustrates, by way of example, a curve 370-1 corresponding to a command signal that is electronically sent to an ALD valve from a valve controller, a curve 370-2 corresponding to a solenoid pilot valve electrical profile, a curve 370-3 corresponding to a diaphragm position and a curve 370-4 corresponding to an electronic position sensor signal. In operation, when a command signal is given by a valve controller as shown in the curve 370-1, the pilot valve is activated, as shown in the curve 370-2. After the solenoid pilot valve fully opens, the diaphragm changes its position and the valve opens, as shown in the curve 370-3. As shown in FIG. 3D, the time duration between the opening of the valve as verified by the sensor and the opening of the pilot valve defines the actuation speed. After the valve fully opens, the position sensor senses the position of the diaphragm and determines that the valve has completed its opening. As defined herein, a response time of an ALD valve corresponds to, as illustrated in FIG. 3D, the time it takes, from the time a command signal is electronically sent to an ALD valve from a valve controller to the time the ALD valve to fully opened or closed, as sensed by the diaphragm position sensor. For the illustrated ALD valve, the actuation speed is less than 5 ms and the response time is less than 15 ms.

As discussed above, the precursor delivery systems disclosed herein allow for a combined flow rate of a precursor through two or more ALD valves that is much higher than conventional thin film deposition systems, such that an ALD cycle time can be significantly decreased. In addition, the inventors have discovered that the duration of an ALD cycle can be reduced by various other improvements disclosed herein.

The inventors have discovered that reducing the distance between the outlet (OUT) of ALD valve(s) and the substrate (valve-to-substrate distance) can advantageously and critical further reduce the time needed for sufficient substantial surface saturation and/or ALD cycle time. Thus, according to embodiments, the ALD valves according to embodiments are disposed directly over the lid portion of each processing station, which is in turn disposed over a corresponding susceptor. The ALD valves are, e.g., disposed within 30", 25", 20", 15", 10", 5", 3" or a distance within a range defined by any of these values, or 50 cm, 40 cm, 30 cm, 20 cm, 10 cm, 5 cm or a distance within a range defined by any of these values, relative to a main surface of the substrate (FIG. 1). The valve-to-substrate distance can be a sum of the vertical distance between the an outlet (OUT) of a precursor ALD valve relative to the central outlet 332 (FIG. 3B) defining a bottom end of the central conduit 324 (FIG. 3B), as described above with respect to FIG. 3B, and the vertical distance from the central outlet 332 to the substrate surface.

The inventors have discovered that the arrangement of the tubing between the actuator(s) of the ALD valve(s) and a solenoid of the pilot valve can further affect the ALD valve response time. In particular, the inventors have discovered that reducing the length of the tubing advantageously reduces the valve response time. The inventors have discovered that by reducing the length of the tubing, which can be ⅛" or ¼" in diameter, between the actuator assembly of the ALD valve in the upper part 354 (FIG. 3C) and the valve body part in the lower part 358 (FIG. 3C), and more particularly, e.g., the distance between the solenoid in the actuator assembly and the diaphragm in the body, the response time can be further reduced. According to embodiments, this distance is less than 5", 4", 3", 2", 1", 0.5", or has a value in a range defined by any of these values, or 10 cm, 8 cm, 6 cm, 4 cm, 2 cm, 1 cm or a value in a range defined by any of these values. For example, by reducing the length from 36 inches to 3 inches, it was found that the response time can be reduced by as much as 10 ms.

Thus configured, the ALD valves according to embodiments are configured to operate with an actuation speed and a response time that are significantly improved compared to conventional valves in ALD systems. According to various embodiments, the actuation speed of the ALD valve can be reduced to be less than 10 ms, 5 ms, 4 ms, 3 ms, 2 ms, or a value in a range defined by any of these values, and the response time can be reduced to be less than 30 ms, 25 ms, 20 ms, 15 ms, 10 ms, 5 ms, or a value in a range defined by any of these values. These values can be achieved, e.g., with 50-90 psig actuation pressure.

The inventors have also found that valve coefficients should be optimized to increase the flow rate for a given pressure drop to enhance the response time. According to various embodiments, the ALD valves have a valve flow coefficient ($C_v$) exceeding 0.20, 0.30, 0.40, 0.50, 0.60, 0.70 or a value in a range defined by any of these values.

Under some circumstances, the ALD valves according to embodiments are advantageously configured to be operated at elevated temperatures. For example, when it is desirable for a precursor, e.g., a vaporized liquid precursor, to be introduced into the deposition chamber at an elevated temperature, it may be advantageous for the corresponding ALD valve and/or the multivalve block to be heated to a temperature greater than room temperature, e.g., to match the precursor temperature at the point of introduction into the multivalve block. According to various embodiments, the ALD valves are configured to operate at valve temperature exceeding 80° C., 100° C. 150° C., 200° C., 250° C. or a temperature in a range defined by any of these values. In particular, referring back to FIG. 3C, the lower part 358 may include a heater for heating the valve body part. In these embodiments, the coupling portion 362 may include a thermally insulating housing portion to reduce the heating effect on the upper part 354, because heating may have detrimental effects on the operation of the actuator assembly, e.g., reduced repeatability of the actuation speed.

According to various embodiments, each of the ALD valves are configured for open/close cycles exceeding 2 million, 5 million, 10 million, 20 million, 50 million, 100 million, or a value in a range defined by any of these values, before replacement or repair. When a single ALD valve is used for a given precursor, a preventive maintenance may be performed after such number of cycles. Advantageously, when two or more valves are alternately used to introduce a given precursor, the lifetime of the ALD valves on a per wafer processing basis can be proportionally increased. It will be appreciated increasing the time duration between preventive maintenance or chamber openings can greatly enhance productivity and reduce production cost.

Figure 4:
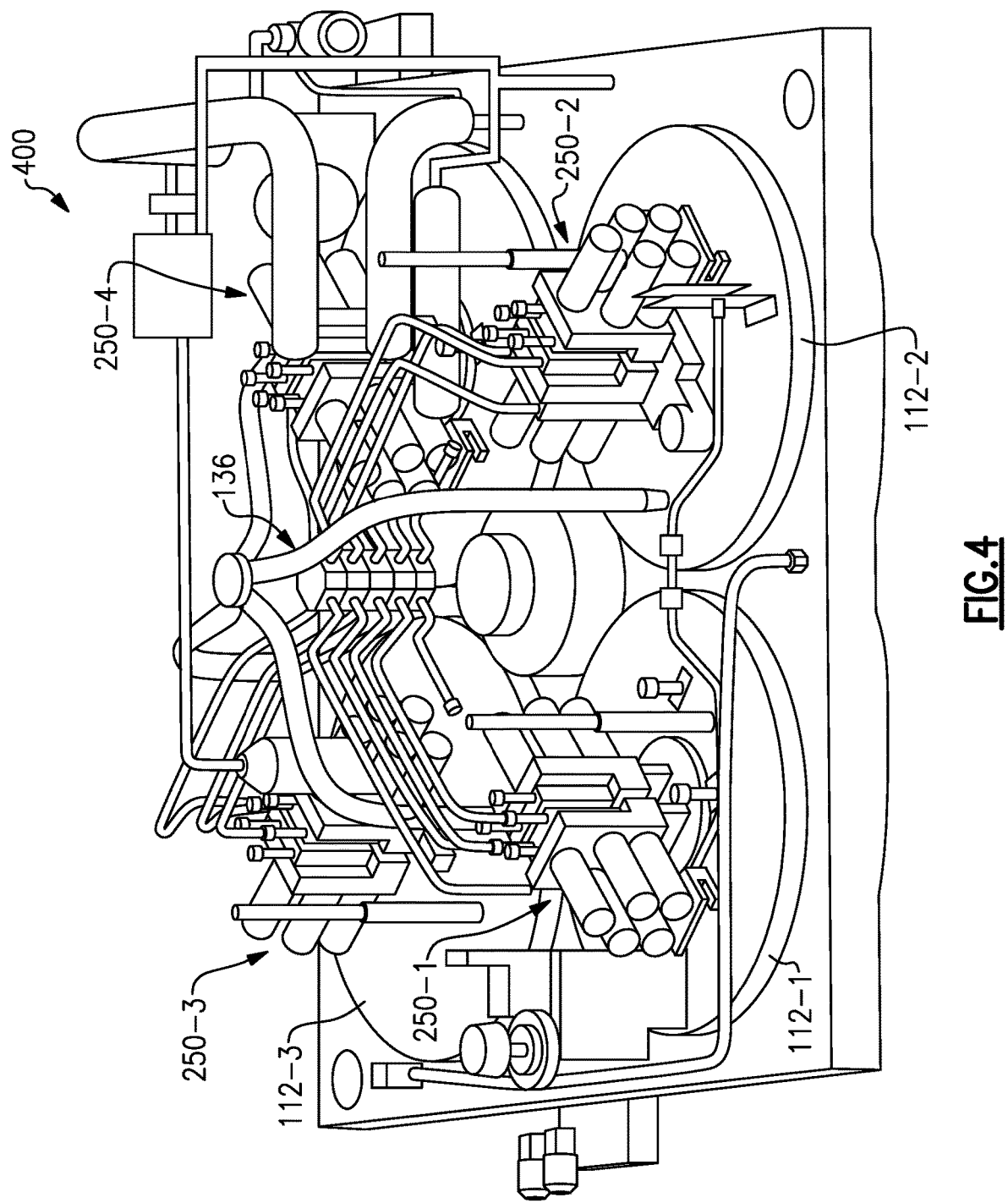
FIG. 4 shows a perspective view of a top external portion of a deposition chamber including multiple processing stations each configured to deliver a precursor using two or more ALD valves connected in parallel to a common gas distribution plate, according to embodiments.

FIG. 4 shows an example deposition chamber in which various embodiments can be implemented. FIG. 4 shows a perspective view of a top external portion of a deposition chamber including multiple processing stations each configured to deliver a precursor using two or more ALD valves connected in parallel to a common gas distribution plate, according to embodiments. Each processing station is configured, e.g., in a similar manner as described above with respect to FIG. 1, and comprises a respective lid portion. Referring back to FIG. 1, after a respective one of the MFCs, each of the gas delivery lines branch off into multiple lines at a respective manifold 136. Each of the branched off lines can feed a respective gas into one of the processing stations.

The illustrated process chamber comprises one or more processing stations each configured to process a substrate on a support, e.g., a susceptor, under a process condition, in a similar manner as described above with respect to FIG. 1. Each processing station is configured to process a substrate under a unique process condition, including a process temperature and a process pressure. In the illustrated embodiment, there are four processing stations having corresponding lid portions 112-1, 112-2, 112-3, 112-4. The lid portions 112-1, 112-2, 112-3, 112-4 have attached thereon, at central locations thereof respective ones of multivalve blocks 250-1, 250-2, 250-3, 250-4. Each of the multivalve blocks 250-1, 250-2, 250-3, 250-4 can be configured in a similar manner as described above with respect to FIGS. 3A-3D, the details of which are not repeated herein for brevity. In addition, gas lines for delivering the same gas to the multivalve blocks 250-1, 250-2, 250-3, 250-4 branch off from common manifolds 136 as shown, similar to the manifolds 136 described above with respect to FIG. 1. The illustrated deposition chamber is thus configured to, for each processing station, introduce one or more precursors using two or more atomic layer deposition (ALD) valves each configured to supply a precursor and/or a purge gas, according to embodiments. While illustrated process chamber is a multi-station process chamber, it will be appreciated that the embodiments disclosed herein are not limited thereto, and can be implemented in any suitable single wafer or multi-wafer process chambers.

Thin Film Deposition Methods Using Two or More Valves for the Same Precursor

Using the thin film deposition system described above, various advantageous methods of depositing a thin film can be implemented. According to various embodiments, a method of depositing a thin film comprises alternatingly exposing a substrate in a thin film deposition chamber to a plurality of precursors. Exposing the substrate comprises introducing one of the precursors into the thin film deposition chamber through two or more atomic layer deposition (ALD) valves each configured to supply the one of the precursors.

Figure 5A:
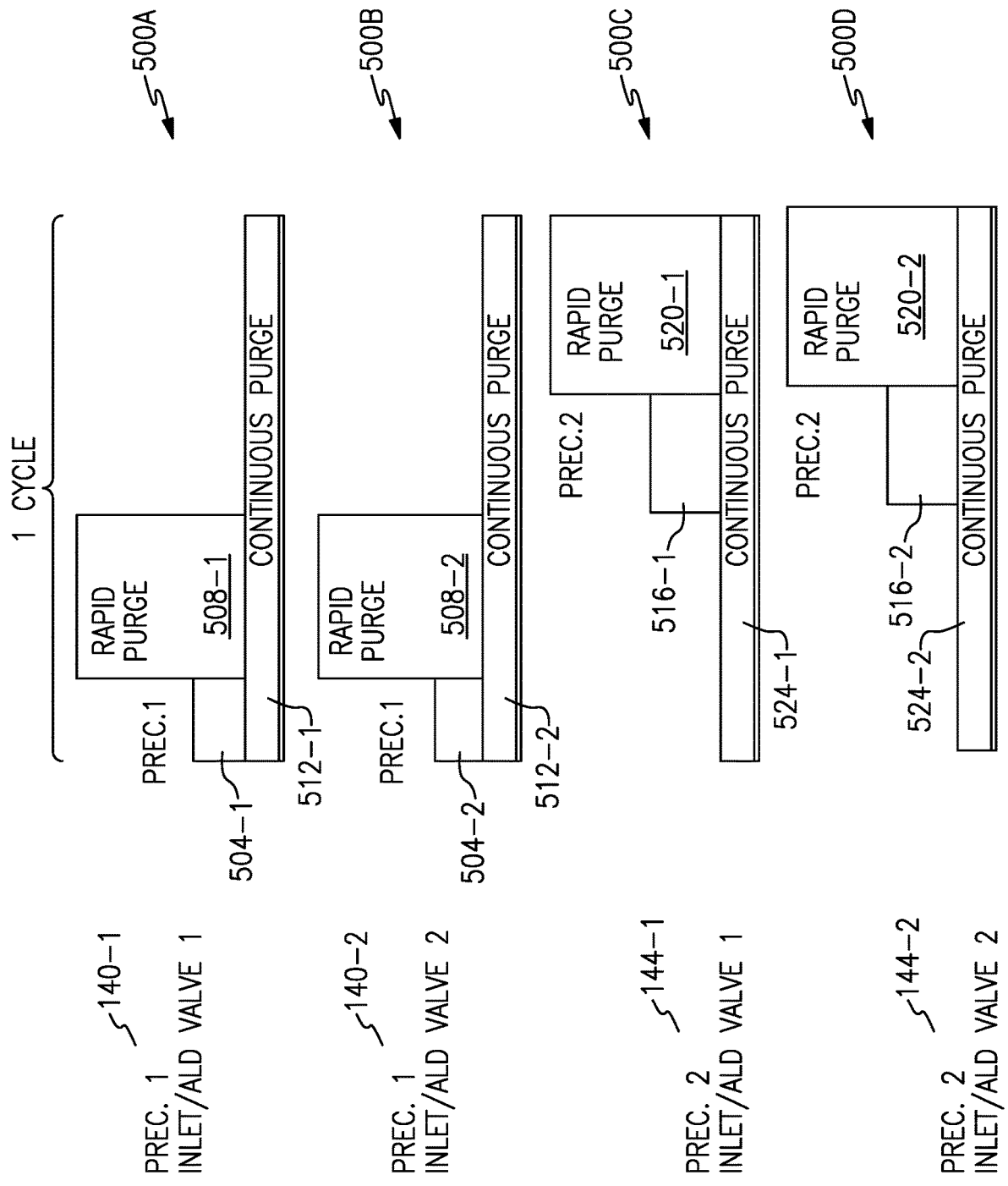
FIG. 5A illustrates an example precursor delivery sequence for depositing a thin film including exposure sequences for a precursor using two or more ALD valves connected in parallel to a common gas distribution plate in one cycle, according to some embodiments.

FIG. 5A illustrates an example precursor delivery sequence of an ALD cycle for depositing a thin film including exposure sequences for a precursor using two or more ALD valves in one cycle, according to some embodiments. The illustrated method of depositing a thin film comprises alternatingly exposing a substrate in a thin film deposition chamber to a plurality of precursors (Prec. 1, Prec. 2). Alternatingly exposing the substrate comprises introducing a first one of the precursors (Prec. 1) into the thin film deposition chamber by independently actuating two or more first atomic layer deposition (ALD) valves connected in parallel to a common gas distribution plate for supplying the first one of the precursors into the thin film deposition chamber. Independently actuating the two or more first ALD valves comprises simultaneously opening the two or more first ALD valves for at least part of the time during introducing the first one of the precursors into the thin film deposition chamber.

The illustrated ALD cycle comprises a first subcycle including exposure cycles 500A and 500C for exposing a substrate to a first one of the precursors (Prec. 1), and a second subcycle including exposure cycles 500C and 500D for exposing the substrate to a second one of the precursors (Prec. 2). The illustrated example shows, during the first subcycle, introducing the Prec. 1 from two first precursor sources 120-1, 120-2 (FIG. 1) using two first precursor ALD valves 140-1, 140-2 (FIG. 1). Actuating the two more precursor ALD valves for the Prec. 1 is represented by exposure cycles 500A and 500B representing gas flows through the first precursor ALD valves 140-1 and 140-2, respectively. The exposure cycles 500A and 500B include exposures of the substrate to the first precursor (Prec. 1) pulses 504-1 and 504-2, respectively, by introducing the Prec. 1 into the deposition chamber using the two first precursor ALD valves 140-1 and 140-2, respectively. The Prec. 1 pulses 504-1 and 504-2 are followed by exposures of the substrate to first rapid purge (RP) pulses 508-1 and 508-2 by introducing the RP gas into the deposition chamber using the first purge gas ALD valve 148-1. As illustrated, actuating the two first precursor ALD valves 140-1, 140-2 comprises at least temporarily simultaneously opening the two first precursor ALD valves 140-1, 140-2 for at least part of the time during introducing the Prec. 1 into the thin film deposition chamber. Thus, the first precursor pulses 504-1 and 504-2 overlap at least part of the time, or substantially or completely overlap, as illustrated. In the illustrated example, the first RP pulses 508-1 and 508-2 completely overlap because they are provided using the same first purge gas ALD valve 148-1. However, when different ALD purge valves are used, the purge pulses 508-1 and 508-2 may overlap part of the time or substantially or completely overlap, as illustrated.

Additionally or alternatively, as the illustrated example shows, during the second subcycle, introducing the Prec. 2 from two second precursor sources 124-1, 124-2 (FIG. 1) using two second precursor ALD valves 140-1, 140-2, which may be configured in a similar manner as described above. Actuating the two more ALD valves is represented by exposure cycles 500C and 500D representing gas flows through the second precursor ALD valves 144-1 and 144-2, respectively. The exposure cycles 500C and 500D include exposures of the substrate to the second precursor (Prec. 2) pulses 516-1 and 516-2, respectively, by introducing the Prec. 2 into the deposition chamber using the second precursor ALD valves 144-1 and 144-2, respectively. The Prec. 2 pulses 516-1 and 516-2 are followed by exposures of the substrate to second rapid purge (RP) pulses 520-1 and 520-2 by introducing the RP gas into the deposition chamber using the second purge gas ALD valve 148-2. As illustrated, actuating the two second precursor ALD valves 144-1, 144-2 comprises at least temporarily simultaneously opening the two second precursor ALD valves 144-1, 144-2 for at least part of the time during introducing the Prec. 2 into the thin film deposition chamber. Thus, the second precursor pulses 516-1 and 516-2 overlap at least part of the time or substantially or completely overlap, as illustrated. In the illustrated example, the second RP pulses 520-1 and 520-2 completely overlap because they are provided using the same second purge gas ALD valve 148-2. However, when different ALD purge valves are used, the purge pulses 520-1 and 520-2 may overlap part of the time or substantially or completely overlap, as illustrated.

As described above, each of the precursor ALD valves is a three-port valve, and in some implementations, a continuous purge (CP) gas, e.g., an inert gas, may be flown through the ALD valves while the substrate is exposed to the first precursor and/or the second precursor. The inventors have found that, flowing the CP gas during the ALD cycles advantageously can reduce the exposure time for the RP pulses, thereby further improving the cycle time. In the illustrated embodiment, the exposure cycles 500A-500D further comprises continuously exposing the substrate to respective ones of CPs 512-1, 512-2, 524-1, 524-2, respectively using an inert gas during and following the exposure to one or both of the first and second precursors. The rapid purge is higher in magnitude than the CP.

Advantageously, as described above, one or both of the first (Prec. 1) and second (Prec. 2) precursors may be introduced into the thin film deposition chamber through respective ones of two or more precursor ALD valves 140-1, 140-2, 144-1, 144-2. Thus, one or both of the first and second precursors may be introduced into the thin film deposition chamber at a combined flow rate of the two or more precursor ALD valves. As such, an exposure time to reach a saturation level can be substantially reduced for one or both of the first and second precursors. For example, according to some embodiments, for a given precursor, relative to an exposure time to reach a saturation level using only one precursor ALD valve, the exposure time can be reduced by more than 20%, 40%, 60%, 80%, or a value in a ranged defined by any of these values. The surface saturation level can be inferred, e.g., based on the rate of deposition rate, as described above. That is, relative to an ALD process using only one ALD valve for a given precursor, substantially the same thickness can be achieved while reducing the exposure time for the precursor by more than 20%, 40%, 60%, 80%, or a value in a ranged defined by any of these values.

According to various embodiments, by employing two or more precursor ALD valves, the exposure time of one or both of the first (Prec. 1) and second (Prec. 2) precursors can be kept less than 1.0 sec., 0.8 sec., 0.6 sec, 0.4 sec, 0.2 sec., 0.1 sec., or a value in a ranged defined by any of these values. The thin film deposition system is configured to introduce one or both of the first and second precursors using two or more precursor ALD valves at a combined flow rate such that a surface of the substrate substantially reaches a saturation level, e.g., a saturation level greater than 40%, 60%, 80% or a value in a range defined by any of these values, despite the relatively shorter exposure time. In embodiments where a rapid purge follows an exposure to a precursor, durations of one or both of the first and second subcycles can be less than 1.0 sec., 0.8 sec., 0.6 sec, 0.4 sec, 0.2 sec., 0.1 sec., or a value in a ranged defined by any of these values. By reducing the exposure times of one or both of the first and second precursors, the durations of one or both of the corresponding first and second subcycles may be reduced, thereby reducing the overall ALD cycle time. According to embodiments, a duration of the overall ALD cycles is less than 2.0 sec., 1.5 sec, 1.0 sec., 0.5 sec., or a value in a range defined by any of these values.

Figure 5B:
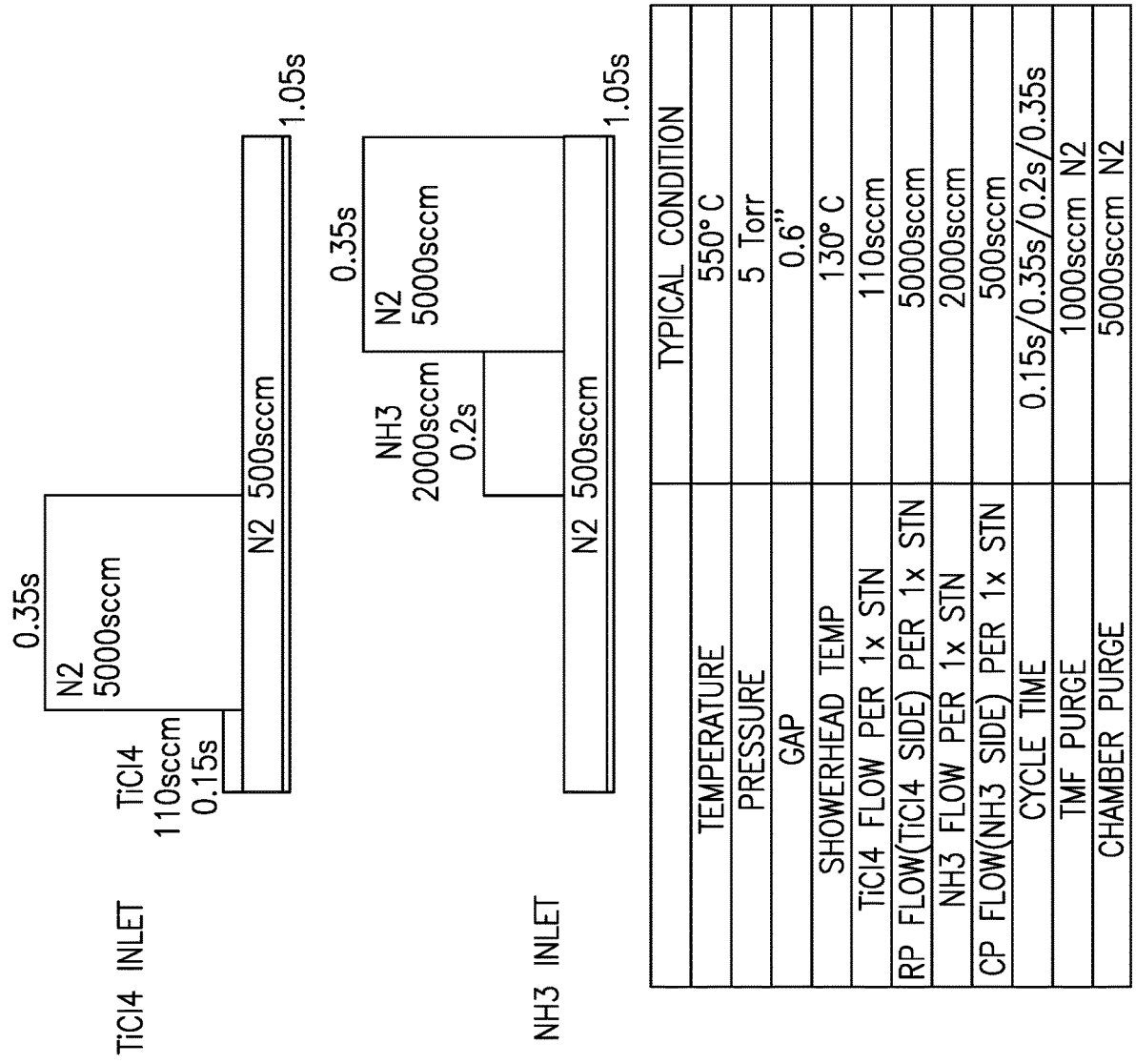
FIG. 5B illustrates precursor delivery conditions for one specific example of cyclic deposition or ALD of TiN using $TiCl_4$ and $NH_3$, in accordance with the delivery sequence illustrated with respect to FIG. 5A.

FIG. 5B illustrates, by way of example only, one specific example precursor delivery sequence for delivering precursors for cyclic deposition or ALD of TiN using $TiCl_4$ and $NH_3$, in accordance with the method described above with respect to FIG. 5A. The illustrated upper exposure cycle can correspond to the exposure cycles 500A and 500B described above with respect to FIG. 5A, and can represent a $TiCl_4$ exposure cycle through first precursor ALD valves 140-1, 140-2. Similarly, the illustrated lower exposure cycle can correspond to the exposure cycles 500C and 500D described above with respect to FIG. 5A, and can represent a $NH_3$ exposure cycle through second precursor ALD valves 144-1, 144-2. A process station similar to that described above with respect to FIG. 1 or 4 can be employed. For example, the process station may be configured to deliver $TiCl_4$ through two first precursor ALD valves 140-1, 140-2 (FIG. 2) and $NH_3$ through four second precursor ALD valves 220-1, 220-2, 220-3, 220-4 (FIG. 2). Each of the precursor ALD valves 140-1, 140-2, 220-1, 220-2, 220-3, 220-4 (FIG. 2) are also configured to continuously flow a continuous purge (CP) gas, e.g., an inert gas, therethrough. The process station may also be configured to deliver a rapid purge (RP) gas, e.g., an inert gas, through two purge gas ALD valves 148-1, 148-2. For example, the process station may also be configured to deliver the first RP pulses 508-1, 508-2 through one of the purge gas ALD valves 148-1, e.g., after one of the first precursor pulses 504-1, 504-2 (FIG. 5A), and the second RP pulses 520-1, 520-2 through another one of the purge gas ALD valves 148-2, e.g., after one of the second precursor pulses 516-1, 516-2 (FIG. 5A). The illustrated table shows typical parameters for a given processing station and flow conditions for different ALD valves. By delivering, in this example, $TiCl_4$ simultaneously through two precursor ALD valves 140-1, 140-2 (FIG. 2) and $NH_3$ simultaneously through four precursor ALD valves 220-1, 220-2, 220-3, 220-4 (FIG. 2) and $N_2$ through one of two purge gas ALD valves 148-1, 148-2, during respective subcycles, combined flow rates of 220 sccm and 8000 sccm for $TiCl_4$ and $NH_3$ can be achieved, respectively. In combination with the 5000 sccm flow rate for each of purge gas ALD valves 148-1, 148-2, $TiCl_4$ exposure subcycle time of 0.5 sec. and $NH_3$ exposure subcycle time of 0.35 sec. can be achieved, for a total ALD cycle time of 1.05 sec.

Advantageously, by flowing relatively high amounts of precursor and the CP gas through two or more precursor ALD valves, relatively high chamber pressure can be achieved without reducing pumping power of the deposition chamber. The inventors have discovered that, when a substrate has a relatively high surface area, e.g., arising from a relatively high area density of high aspect ratio structures, coating the exposed surface with a thin film using ALD process recipes developed based on characterization of thin films formed on a planar or unpatterned substrate or a substrate with relatively low surface area or low area density of high aspect ratio structures may yield thin films having different characteristics at different parts of the exposed surface. For example, the conformality or step coverage as described above may be significantly worse in high aspect ratio structures in substrates having a relatively high area density thereof. Other characteristics that may also be different at different parts of the exposed surface include film stoichiometry, surface roughness, electrical resistivity and film density, to name a few. Without being bound to any theory, one reason for the low uniformity of the characteristics may be the significantly increased exposed surface area of the substrate relative to a planar substrate. Because of the increased exposed surface area, different parts of the exposed surface may receive different magnitudes of the flux of precursors, such that different amounts of precursors may be adsorbed on different parts of the exposed surface. By way of a simplified example only, when a 300 mm semiconductor substrate has formed thereon hundreds of dies each having of the order of $1 \times 10^{10}$ or more transistors and each transistor has one or more vias having a diameter of 10-100 nm and an aspect ratio of 1 to 100, the surface area exposed to precursors during the deposition of the thin film can exceed the surface area of a corresponding unpatterned substrate 10, 100, 1000 or more. In addition, local deposition conditions at different parts of the exposed surface may be different. For example, local pressure inside a deep trench or a via may be different, e.g., lower, compared to regions outside the deep trench or the via. In addition, under vacuum conditions, because gas molecules undergo more collisions with sidewalls of the trench or the via, upper portions of the deep trench or the via may adsorb a higher amount of precursor molecules from being subjected to a higher flux.

According to various embodiments described herein, by utilizing higher deposition pressure, among other things, the inventors have discovered that the deposition methods described herein are particularly advantageous for forming thin films comprising TiSiN and/or TiAlN at different parts of the exposed surface with higher uniformity with respect to various physical characteristics including conformality, step coverage, film stoichiometry, surface roughness, electrical resistivity and film density, to name a few. Thus, the thin film comprising TiSiN and/or TiAlN formed according to deposition methods disclosed herein have higher uniformity at both local (e.g., within a trench or via) and global (e.g., within-wafer) levels with respect to one or more of these physical characteristics. Thus, the deposition methods according to embodiments are particularly advantageous for forming the thin film comprising TiSiN and/or TiAlN on a substrate that comprises a surface topography such that a ratio of a surface area of the semiconductor substrate exposed to the one or more vapor deposition cycles to a surface area of a corresponding unpatterned semiconductor substrate exceeds 2, 5, 10, 20, 50, 100, 200, 500, 1000 or has a ratio in a range defined by any of these values, or higher.

Alternatively or additionally, the deposition methods according to embodiments are additionally particularly advantageous for forming the thin film on a substrate that comprises high aspect ratio structures having an opening width less than 1 micron, 500 nm, 200 nm, 100 nm, 50 nm, 20 nm or a value in a range defined by any of these values, an aspect ratio exceeding 5, 10, 20, 50, 100, 200 or a value in a range defined by any of these values, and an area density such that the surface area is greater than a that of a planar substrate as described above. Substrates having such topography may be conformally coated with thin films comprising TiSiN and/or TiAlN according to embodiments with a step coverage as defined above that exceeds 50%, 60%, 70%, 80%, 90%, 95%, or has a value in a range defined by any of these values or higher. As discussed above, the inventors have found that process conditions for conformally coating a substrate having a relatively high area density of high aspect ratio structures may be optimized according to embodiments to achieve these results. The inventors have discovered that these results may be achieved by controlling, among other things, the reaction chamber pressure or partial pressures of precursors during exposures of the substrate, the deposition rate, the temperature or pressure of precursors being introduced into the reaction chamber, the flow rate of the precursors and the exposure time, to name a few.

The inventors have discovered that relatively higher total or partial pressures achieved using simultaneous activation of two or more precursor ALD valves can lead to improvement in conformality and step coverage when coating a substrate having a relatively high area density of high aspect ratio structures, according to embodiments. Without being bound to any theory, such improvement may be associated with, among other things, lessening the effect of locally reduced partial pressure of precursors inside the high aspect ratio vias or trenches. According to embodiments total or partial pressures of any of the individual precursors during exposing the substrate during a given subcycle (e.g., Ti precursor, N precursor and/or Si and/or Al), may be 1.0-3.0 torr, 3.0-5.0 torr, 5.0-7.0 torr, 7.0-9.0 torr, 9.0-11.0 torr, 11.0-13.0 torr, 13.0-15.0 torr, or a pressure in range defined by any of these values. In each of the exposures to the Ti precursor, the N precursor and/or the Si and/or Al precursor, the respective precursor can make up 1-2%, 2-5%, 5-10%, 10-20%, 20-50%, 50-100% of the total amount of gas molecules in the reaction chamber, or a percentage in a range defined by any of these values. The inventors have discovered that, under some circumstances, when the total or partial pressure is outside of these values, step coverage may start to degrade, among other things.

The inventors have discovered that, in part to enable relatively high throughput while delivering relatively high amounts of precursors to the reaction chamber for deposition at relatively high total or partial pressures, the flow rates of the precursors into the reaction chamber should be significantly higher than those used in process conditions for forming thin films on planar substrates and/or substrates with low (e.g., <1) aspect ratio structures. The high flow rates can in turn may be achieved by increasing one or both of the temperatures or the pressures of the precursors prior to introduction into the reaction chamber. For example, for precursors in liquid form under manufacturing conditions, the precursor bottles may be heated to temperatures higher than a room temperature, e.g., 30-60° C., 60-80° C., 80-100° C., 100-120° C., 120-150° C., or a temperature in a range defined by any of these values, to increase the vapor generation rate. The lower and upper bottle temperatures of these ranges may be determined in part based on the vapor pressure of the precursor and the decomposition temperature of the precursor, respectively. By way of example, $TiCl_4$ may be heated to about 60-80° C. On the other hand, for precursors in gas form under manufacturing conditions, the high flow rate may be achieved by increasing the gas line pressures to increase the delivery pressures to values that are much higher relative to gas line pressures used in forming thin films on relatively low surface area or planar substrates and/or substrates with low (e.g., <1) aspect ratio structures. It will be appreciated that the relatively high flow rate to achieve various advantages described herein can depend on, among other things, the pumping rate, exposure time, and volume of the reactor. To achieve flow rates adapted for depositing the thin film on substrates having a high surface area and/or high aspect ratio structures, the temperature and or pressure of the precursor, among other parameters, can be adjusted such that the flow rate of each of the Ti, N, Si and Al precursors can be, e.g., 100-1000 standard cubic centimeters per minute (sccm), 1000-2000 sccm, 2000-5000 sccm, 5000-10,000 sccm, 10,000-15,000 sccm, 15,000-20,000 sccm, or a value in a range defined by any of these values or higher. It will be appreciated that a suitable flow rate can depend, among other things, the volume of the reactor, and some of these flow rates may be suitable for single wafer reactors having a volume of about 1-2 liters.

In the illustrated ALD cycle of FIG. 5A, each one of the two or more ALD valves used to deliver a given precursor or a purge gas is actuated during the same one of each of the subcycles. As such, each of the illustrated exposure cycles 500A-500D is repeated each in each cycle using the same ones of the respective ALD valves through multiple cycles. Thus, the sum of exposure cycles 500A-500D illustrated in FIG. 5A represents one full ALD cycle, and the same cycle maybe repeated any number of times. As discussed above, such embodiments provide the advantage of increased flow rate, increased pressure and fast cycle time. However, embodiments are not so limited. In other embodiments, different subcycles for a given precursor exposure may be performed by introducing the given precursor into the thin film deposition chamber using different ones of two or more ALD valves, e.g., in different cycles. For example, a first one of two or more precursor ALD valves may be used to introduce one of the precursor in a first cycle, while a second one of the two or more precursor ALD valves may be used to introduce the same one of the precursor in a second cycle.

Thus, by way of example, in the precursor subdelivery system shown in FIG. 2 in which four precursor ALD valves are configured to deliver $NH_3$, a first cycle may be performed using first and second ALD valves to deliver $NH_3$, while a second cycle may be performed using third and fourth ALD valves to deliver $NH_3$. Advantageously, by alternating different ones of ALD valves to deliver a precursor, a wear out rate of the ALD valves can be reduced, thereby increasing the period of time between valve replacements or service, which in turn reduces the down time of the deposition system. One such example embodiment is illustrated in FIG. 6.

Figure 6:
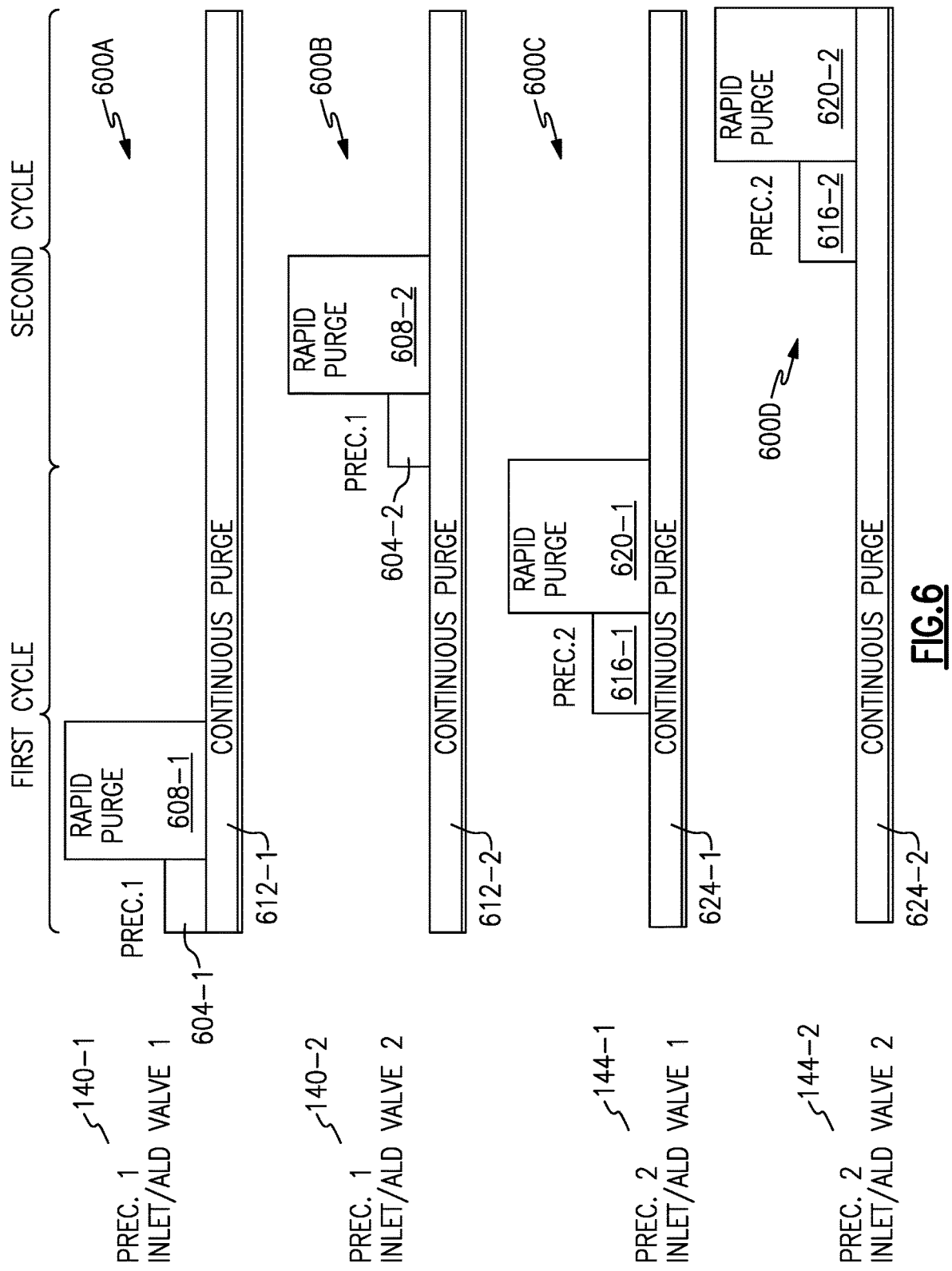
FIG. 6 illustrates an example precursor delivery sequence for depositing a thin film including exposure sequences for a precursor using two or more ALD valves connected in parallel to a common gas distribution plate over two more cycles, according to some embodiments.

FIG. 6 illustrates an example precursor delivery sequence over two ALD cycles for depositing a thin film including exposure sequences for a precursor using two or more ALD valves connected in parallel to a common gas distribution plate over two or more cycles, according to some embodiments. The illustrated method of depositing a thin film comprises alternatingly exposing a substrate in a thin film deposition chamber to a plurality of precursors. Alternatingly exposing the substrate comprises introducing a first one of the precursors (Prec. 1) into the thin film deposition chamber by independently actuating two or more first atomic layer deposition (ALD) valves connected in parallel to a common gas distribution plate for supplying the first one of the precursors into the thin film deposition chamber. Independently actuating the two or more first ALD valves comprises actuating a first one of the two or more first ALD valves during a first cycle and actuating a second one of the two or more first ALD valves during a second cycle subsequent to the first cycle. In the following, features of the delivery sequence illustrated in FIG. 6 that are similar to those of the delivery sequence illustrated in FIG. 5A are omitted for brevity.

The illustrated ALD cycles comprises a first cycle including exposure cycles 600A, 600C, and a second cycle including exposure cycles 600B, 600D. Each of the first and second cycles comprises a first subcycle for exposing a substrate to a first one of the precursors (Prec. 1), and a second subcycle for exposing the substrate to a second one of the precursors (Prec. 2). The illustrated example shows, during the first subcycle of the first cycle, introducing the Prec. 1 from one of two first precursor sources 120-1, 120-2 (FIG. 1) using one of two first precursor ALD valves 140-1, 140-2, and during the first subcycle of the second cycle, introducing the Prec. 1 from the other of the two first precursor sources 120-1, 120-2 (FIG. 1) using the other of two first precursor ALD valves 140-1, 140-2. Actuating the two more precursor ALD valves for the Prec. 1 is represented by exposure cycles 600A and 600C representing gas flows through the first precursor ALD valves 140-1 and 140-2, respectively, in two separate cycles. The exposure cycles 600A and 600C include exposures of the substrate to the first precursor (Prec. 1) pulses 604-1 and 604-2, respectively, by introducing the Prec. 1 into the deposition chamber using the two first precursor ALD valves 140-1 and 140-2, respectively. The Prec. 1 pulses 604-1 and 604-2 are followed by exposures of the substrate to first rapid purge (RP) pulses 608-1 and 608-2 for introducing the RP gas into the deposition chamber using the first purge gas ALD valve 148-1. Unlike the sequence described above with respect to FIG. 5A, actuating the two first precursor ALD valves 140-1, 140-2 do not include simultaneously or overlappingly opening the two first ALD valves 140-1, 140-2. Instead, actuating the two first ALD valves 140-1, 140-2 occur in two separate ALD cycles. Similarly, the first RP pulses 608-1 and 608-2 do not overlap because they are performed in two separate ALD cycles.

Additionally or alternatively, as the illustrated example further shows, during the second subcycle of the first cycle, introducing the Prec. 2 from one of two second precursor sources 124-1, 124-2 (FIG. 1) using one of two second precursor ALD valves 144-1, 143-2, and during the second subcycle of the second cycle, introducing the Prec. 2 from the other of the two second precursor sources 124-1, 124-2 (FIG. 1) using the other of two second precursor ALD valves 144-1, 144-2. Actuating the two more ALD valves for the Prec. 2 is represented by exposure cycles 600B and 600D representing gas flows through the second precursor ALD valves 144-1 and 144-2, respectively, in two separate cycles. The exposure cycles 600B and 600D include exposures of the substrate to the first precursor (Prec. 1) pulses 604-1 and 604-2, respectively, of the Prec. 2 by introducing the Prec. 2 into the deposition chamber using the two second precursor ALD valves 144-1 and 144-2, respectively. The Prec. 2 pulses 616-1 and 616-2 are followed by exposures of the substrate to second rapid purge (RP) pulses 620-1 and 620-2 of a RP gas by introducing the RP gas into the deposition chamber using the second ALD purge valve 148-2. Unlike the sequence described above with respect to FIG. 5A, actuating the two second precursor ALD valves 144-1, 144-2 do not include simultaneously or overlappingly opening the two second ALD valves 144-1, 144-2. Instead, actuating the two second ALD valves 144-1, 144-2 occur in two separate ALD cycles. Similarly, the second RP pulses 620-1 and 620-2 do not overlap because they are performed in two separate ALD cycles.

It will be appreciated that, in a semiconductor manufacturing environment, scheduled and unscheduled downtimes and interruptions of production due to maintenance or replacement of parts can be costly. Because the ALD valves for deposition of a single film can exceed hundreds or even thousands of actuations, scheduled and unscheduled downtimes due to their wear out and failures can be costly. The inventors have found that the sequence such as that shown in FIG. 6, in which the exposure to a given precursor (e.g., Prec. 1, Prec. 2) in different cycles is performed using different ones of two or more ALD valves 140-1, 140-2, 144-1, 144-2, 148-1, 148-2 as described above, can advantageously increase the time intervals for maintenance or replacement of the ALD valves. By using such method, the frequency of repair or preventative maintenance of the deposition system may be substantially reduced.

In the illustrated ALD cycles of FIGS. 5A and 6, two or more ALD valves are used to deliver a given precursor or a purge gas in a continuous pulse for a given subcycle of an ALD cycle. However, embodiments are not so limited. In other embodiments, the two more ALD valves may be used to deliver a given precursor in multiple pulses for a given subcycle. In these embodiments, the exposure sequence may be similar to that described with respect to FIG. 5A except, an exposure of the substrate to a given precursor may be performed in a plurality of back-to-back pulses (without an intervening exposure to a different precursor), which may be performed in the presence of a continuous purge. For example, using the precursor delivery system similar to that shown in FIG. 2 in which four ALD valves are configured to deliver $NH_3$, a first pulse of $NH_3$ may be delivered using first and second ALD valves, while a second pulse of $NH_3$ may be delivered using third and fourth ALD valves. The first and second pulses may be alternated at least once during the same subcycle. One such example embodiment is illustrated in FIG. 7.

Figure 7:
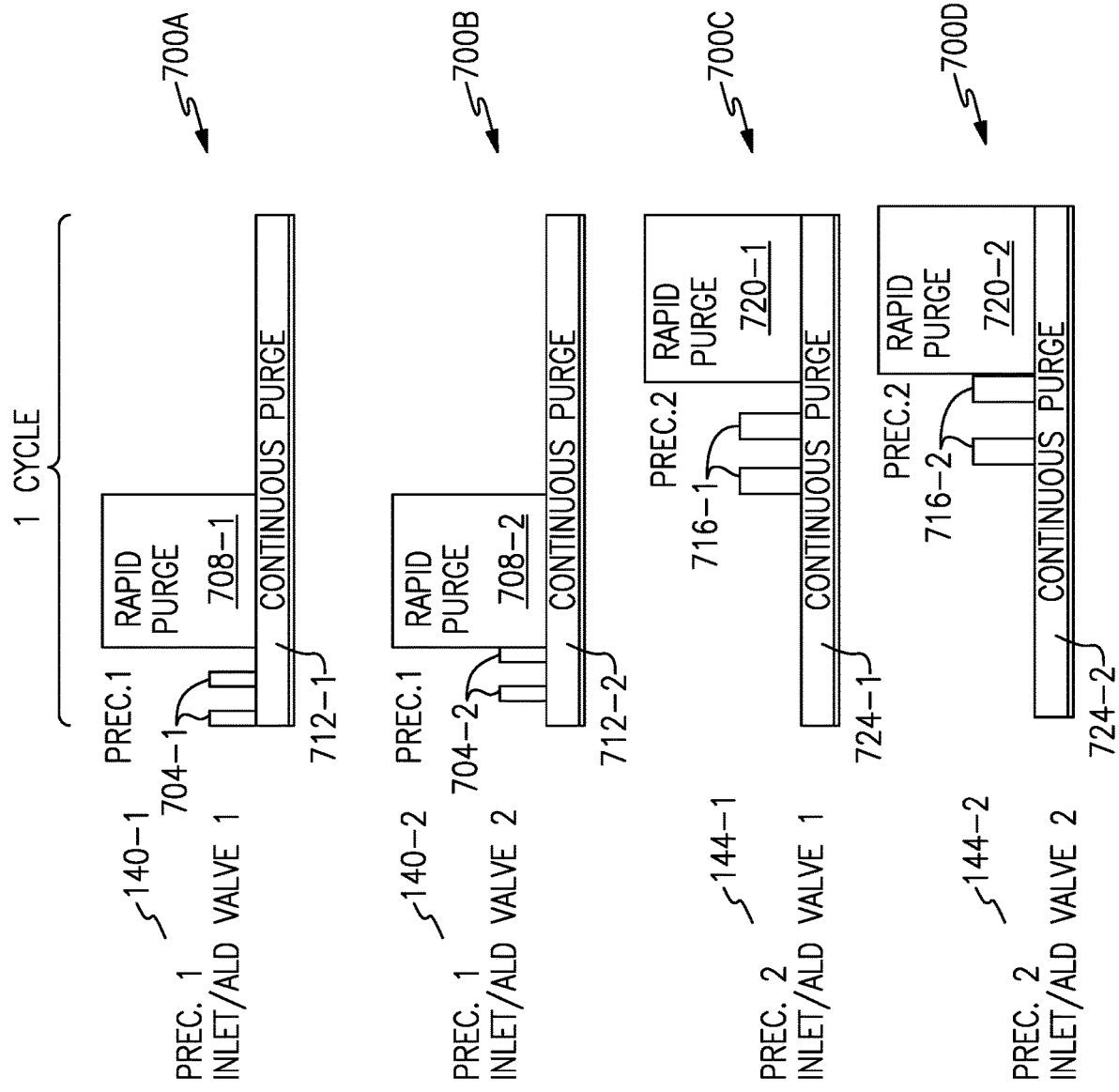
FIG. 7 illustrates an example precursor delivery sequence for depositing a thin film including exposure sequences for a precursor using two or more ALD valves connected in parallel to a common gas distribution plate to deliver a plurality of pulses of the precursor in one cycle, according to some embodiments.

FIG. 7 illustrates an example precursor delivery sequence of an ALD cycle for depositing a thin film including exposure sequences for a precursor using two or more ALD valves connected in parallel to a common gas distribution plate to deliver a plurality of pulses of the precursor in one cycle, according to some embodiments. The illustrated method of depositing a thin film comprises alternatingly exposing a substrate in a thin film deposition chamber to a plurality of precursors. Alternatingly exposing the substrate comprises introducing a first one of the precursors (Prec. 1) into the thin film deposition chamber by independently actuating two or more first atomic layer deposition (ALD) valves connected in parallel to a common gas distribution plate for supplying the first one of the precursors into the thin film deposition chamber. Independently actuating the two or more first ALD valves comprises exposing the substrate in a plurality pulses by alternatingly opening different ones of the two or more first ALD valves during a same one of the cycles. In the following, features of the delivery sequence illustrated in FIG. 7 that are similar to those of the delivery sequence illustrated in FIG. 5A are omitted for brevity.

The illustrated ALD cycle comprises a first subcycle including exposure cycles 700A and 700C for exposing a substrate to a first one of the precursors (Prec. 1), and a second subcycle including exposure cycles 700B and 700D for exposing the substrate to a second one of the precursors (Prec. 2), in a similar manner as those described above with respect to FIG. 5A. However, unlike the sequence described with respect to FIG. 5A, the illustrated example shows, during the first subcycle, introducing the Prec. 1 from two first precursor sources 120-1, 120-2 (FIG. 1) using two first precursor ALD valves 140-1, 140-2 (FIG. 1), in a plurality of pulses 704-1, 704-2. Actuating the two more ALD valves for the Prec. 1 is represented by the exposure cycles 700A and 700B representing gas flows through the first precursor ALD valves 140-1 and 140-2, respectively. The exposure cycles 700A and 700B include exposures of the substrate to the first precursor (Prec. 1) in a plurality of Prec. 1 pulses 704-1 and a plurality of Prec. 1 pulses 704-2, respectively, by introducing the Prec. 1 into the deposition chamber using the two first precursor ALD valves 140-1 and 140-2, respectively. The pulses 704-1 and the pulses 704-2 may alternate as illustrated. The plurality of Prec. 1 pulses 704-1 and Prec. 1 pulses 704-2 are followed by exposures of the substrate to first rapid purge (RP) pulses 708-1 and 708-2 in a manner similar to the sequence described above with respect to FIG. 5A. As illustrated, actuating the two first precursor ALD valves 140-1, 140-2 comprises alternatingly opening the two first precursor ALD valves 140-1, 140-2 to alternatingly deliver the purses 704-1 and 704-2. Thus, the Prec. 1 pulses 704-1 and the Prec. 2 pulses 704-2 do not overlap, as illustrated.

Additionally or alternatively, as the illustrated example shows, the second subcycle includes exposure cycles 700C and 700D, for introducing the Prec. 2 from two second precursor sources 124-1, 124-2 (FIG. 1) using two second precursor ALD valves 144-1, 144-2, which may be configured in a similar manner as described above. Actuating the two more precursor ALD valves for the Prec. 2 is represented by exposure cycles 700C and 700D representing gas flows through the second ALD valves 144-1 and 144-2, respectively. The exposure cycles 700C and 700D include exposures of the substrate to the second precursor (Prec. 2)

in a plurality of Prec. 2 pulses 716-1 and a plurality of Prec. 2 pulses 716-2, respectively, by introducing the Prec. 2 into the deposition chamber using the two second precursor ALD valves 144-1 and 144-2, respectively. The pulses 716-1 and the pulses 716-2 may alternate. The Prec. 2 pulses 716-1 and the Prec. Pulses 716-2 are followed by exposures of the substrate to second rapid purge (RP) pulses 720-1 and 720-2 of a RP gas in a manner similar to the sequence described above with respect to FIG. 5A. As illustrated, actuating the two second precursor ALD valves 144-1, 144-2 comprises alternatingly opening the two first precursor ALD valves 144-1, 144-2 to alternatingly deliver the purses 716-1 and 716-2. Thus, the Prec. 2 pulses 716-1 and the Prec. 2 pulses 716-2 do not overlap, as illustrated.

Advantageously, by alternating different ones of ALD valves to deliver different pulses of a precursor, the amount of overhead time may be reduced, e.g., by sending a command signal for one valve may be sent prior to receiving a sensor signal on another valve. In the illustrated embodiment, the Prec. 1 pulses 704-1 and 704-2 alternate without overlapping with each other and Prec. 2 pulses 716-1 and 716-2 alternate without overlapping with each other. However, in some embodiments, in recognition of a delay between a command signal and the actual opening or closing of the ALD valves as described above with respect to FIG. 3D, a command signal for opening one of the precursor ALD valves may be sent prior to receiving the electronic position sensor signal indicating the closing of the previous one of the precursor ALD valves.

According to embodiments, the Prec. 1 pulses 704-1 and 704-2 can have a duration that is a fraction of the exposure time of Prec. 1 pulses 504-1, 504-2 described above with respect to FIG. 5A. For example, the pulse duration can be 20%, 40%, 60%, 80% or a value in a range defined by any of these values, relative the exposure time described above with respect to FIG. 5A. Similarly, the Prec. 2 pulses 716-1 and 716-2 can have a duration that is a fraction of the exposure time of Prec. 1 pulses 516-1, 516-2 described above with respect to FIG. 5A. For example, the pulse duration can be 20%, 40%, 60%, 80% or a value in a range defined by any of these values, relative the exposure time described above with respect to FIG. 5A. Without being bound to any theory, such multiple-pulsed introduction may improve surface saturation by reducing competition between the precursor molecules and byproduct molecules. For comparable total exposure times, the multiple-pulsed exposure can lead to an effective higher dose and/or improved conformality.

Applications

The thin films comprising TiN or TiSiN formed using different exposure pressures according to various embodiments disclosed herein can be used in a variety of applications, particularly where the substrate comprises a relatively high aspect ratio structure and/or a non-metal surface that can benefit from various advantageous characteristics of the TiN or TiSiN layer as disclosed herein. Example applications include deposition a via, a hole, a trench, a cavity or a similar structure having an aspect ratio, e.g., a ratio defined as a depth divided by a top width, that exceeds 1, 2, 5, 10, 20, 50, 100, 200 or a value in a range defined by any of these values.

Figure 8:
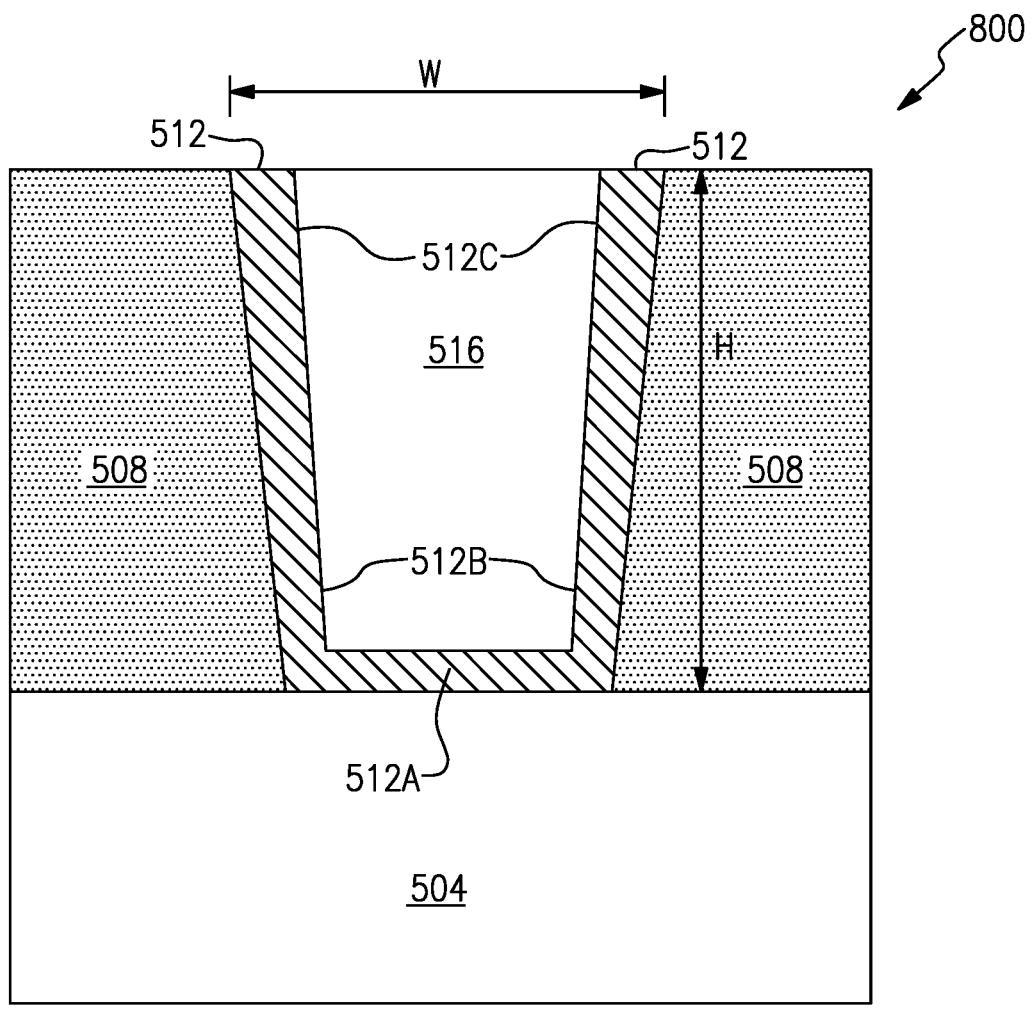
FIG. 8 schematically illustrates a cross-sectional view of a via lined with a thin film layer deposited according to embodiments.

By way of example, FIG. 8 schematically illustrates an application in the context of a diffusion barrier for a contact structure, e.g., a source or drain contact, formed on an active semiconductor substrate region that may be heavily doped. A portion of a semiconductor device 500 is illustrated, which includes a substrate 504 on which a dielectric layer 508, e.g., an interlayer or intermetal dielectric (ILD) layer comprising a dielectric material such as an oxide or nitride is formed. In order to form contacts to various regions of the substrate 504, including various doped regions, e.g., source and drain regions, a via or a trench may be formed through the dielectric layer 508. The via or the trench may expose various non-metal surfaces, e.g., an exposed bottom surface comprising a substrate surface, e.g., a silicon substrate surface, as well as dielectric sidewalls of the vias. The bottom and side surfaces of the via can be conformally coated with a TiN or TiSiN layer. Thereafter, the lined via may be filled with a metal, e.g., W, Al or Cu, to form a contact plug 516. For example, the via may be filled with tungsten by CVD using, e.g., $WF_6$.

The barrier layer 512 formed according to embodiments can be advantageous for various reasons. In particular, due to the conformal nature of the barrier layer 512 formed by ALD, the propensity for a pinching off during the subsequent metal fill process may be substantially reduced. In addition, as described above, the barrier layer 512 can provide effective hindrance of material transport thereacross, e.g., dopant (B, P) out-diffusion from the substrate 504, as well as in-diffusion of reactants, etchants and metals (e.g., F, Cl, W or Cu) from the contact plug formation process. The barrier effect may be enhanced by reduced surface roughness and increased step coverage. Furthermore, a layer-by-layer growth mode obtained according to embodiments may reduce the overall contact resistance of the barrier layer 512. Furthermore, due to the reduced film roughness, a relatively thinner barrier layer 512 may be formed while still accomplishing its desired barrier function, leading to further reduction in contact resistance.

Other applications of the TiN or TiSiN layers formed according various embodiments disclosed herein include conductive structures formed in recessed substrates (e.g., buried electrodes or lines), electrodes (e.g., DRAM capacitor electrodes or gate electrodes), metallization barriers for higher metal levels (e.g., barriers in vias/trenches for Cu contacts/lines), high aspect ratio vertical rod electrodes or vias for three-dimensional memory and through-silicon vias (TSVs), to name a few.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of depositing a thin film, the method comprising:
   alternatingly exposing a substrate in a thin film deposition chamber to a plurality of precursors in a plurality of cycles,
   wherein alternatingly exposing the substrate comprises introducing a first one of the precursors into the thin film deposition chamber by independently actuating two or more first atomic layer deposition (ALD) valves connected in parallel to a common gas distribution plate for supplying the first one of the precursors into the thin film deposition chamber,
   wherein independently actuating the two or more first ALD valves comprises simultaneously opening the two or more first ALD valves for at least part of the time during introducing the first one of the precursors into the thin film deposition chamber during a same one of the cycles, and
   wherein the first one of the precursors passing through the two or more first ALD valves is joined before being introduced through a central opening in the common gas distribution plate.

2. The method of claim 1, wherein the two or more first ALD valves are final valves before the first one of the precursors is introduced into the thin film deposition chamber.

3. The method of claim 2, wherein the two or more first ALD valves are disposed vertically over a central region of the substrate.

4. The method of claim 3, wherein a distance between outlets of the two or more first ALD valves and a main surface of the substrate ranges from 3 inches to 10 inches.

5. The method of claim 2, wherein each of the two or more first ALD valves are connected to a multivalve block disposed outside of the thin film deposition chamber and configured to serve as a hub to receive the first one of the precursors and channel the first one of the precursors into the thin film deposition chamber through internal conduits defined therein.

6. The method of claim 5, wherein the internal conduits comprise a central conduit extending in a vertical direction crossing a main surface of the substrate and connected to the thin film deposition chamber for feeding the first one of the precursors thereinto.

7. The method of claim 6, wherein the central conduit is a final conduit the first one of the precursors passes through before being introduced into the thin film deposition chamber.

8. The method of claim 1, wherein depositing thin film comprises depositing by thermal ALD without an aid of plasma.

9. The method of claim 8, wherein alternatingly exposing the substrate comprises introducing the first one of the precursors comprising one of a metal precursor and an oxidizing precursor, followed by introducing a second one of the precursors comprising the other of the metal precursor and the oxidizing precursor.

10. The method of claim 9, wherein actuating the two or more first ALD valves comprises substantially simultaneously opening the two or more first ALD valves during introducing the first one of the precursors into the thin film deposition chamber.

11. The method of claim 9, wherein introducing the first one of the precursors into the thin film deposition chamber comprises introducing through the two or more first ALD valves at a combined flow rate such that an exposure time for reaching substantial saturation at a surface of the substrate is reduced by 20% to 80%, wherein the substantial saturation corresponds to a condition in which increasing the exposure time does not substantially increase a growth rate.

12. The method of claim 9, wherein introducing the first one of the precursors into the thin film deposition chamber comprises introducing through the two or more ALD valves at a combined flow rate such that an exposure time of the surface of the substrate to the first one of the precursors ranges from 0.1 sec to 1.0 sec.

13. The method of claim 9, wherein alternatingly exposing the substrate comprises introducing the second one of the precursors into the thin film deposition chamber by independently actuating two or more second ALD valves connected in parallel to the common gas distribution plate for supplying the second one of the precursors into the thin film deposition chamber.

14. The method of claim 9, wherein each of the two or more first ALD valves has a response time, between an end of a command signal and completion of opening or closing of a diaphragm thereof, ranging from 5 ms to 30 ms.

15. The method of claim 9, wherein each of the two or more first ALD valves has a valve flow coefficient ($C_v$) exceeding 0.25.

16. The method of claim 9, further comprising heating the two or more first ALD valves to a valve temperature exceeding 80° C. prior to and during actuating the two or more first ALD valves.

17. The method of claim 9, wherein introducing the first one of the precursors into the thin film deposition chamber comprises continuously flowing an inert gas into the thin film deposition chamber through each of the two or more first ALD valves while introducing the first one of the precursors into the thin film deposition chamber.

18. The method of claim 9, further comprising introducing a purge gas into the thin film deposition chamber by actuating two or more purge ALD valves connected in parallel to the common gas distribution plate after introducing each of the precursors.

19. The method of claim 9, wherein the thin film comprises a TiN thin film or a TiSiN thin film.

20. The method of claim 9, wherein the plurality of precursors comprises one or more of a Ti precursor, a Si precursor and a N precursor.

21. The method of claim 9, wherein the thin film deposition chamber comprises a plurality of process stations each configured to deposit the thin film.

\* \* \* \* \*